US009082930B1

(12) United States Patent
Wacker et al.

(10) Patent No.: US 9,082,930 B1
(45) Date of Patent: Jul. 14, 2015

(54) NANOSTRUCTURED THERMOLECTRIC ELEMENTS AND METHODS OF MAKING THE SAME

(71) Applicant: Alphabet Energy, Inc, Hayward, CA (US)

(72) Inventors: Barbara Wacker, Saratoga, CA (US); Mario Aguirre, Livermore, CA (US)

(73) Assignee: Alphabet Energy, Inc., Hayward, CA (US)

( * ) Notice: Subject to any disclaimer, the term of this patent is extended or adjusted under 35 U.S.C. 154(b) by 0 days.

(21) Appl. No.: 14/059,362

(22) Filed: Oct. 21, 2013

Related U.S. Application Data

(60) Provisional application No. 61/718,572, filed on Oct. 25, 2012.

(51) Int. Cl.
    H01L 21/00 (2006.01)
    H01L 35/34 (2006.01)
(52) U.S. Cl.
    CPC .................................... H01L 35/34 (2013.01)
(58) Field of Classification Search
    CPC ......... H01L 35/28; H01L 35/02; H01L 35/04; H01L 35/34; H01L 31/058
    USPC ............ 438/54, 458; 257/467, 470, 777, 798, 257/E31.055, E21.002, E31.093; 136/200, 136/203, 205, 239
    See application file for complete search history.

(56) References Cited

U.S. PATENT DOCUMENTS

| | | |
|---|---|---|
| 2,588,254 A | 3/1952 | Lark-Horovitz et al. |
| 3,441,812 A | 4/1969 | De Bucs et al. |
| 4,251,286 A | 2/1981 | Barnett |

(Continued)

FOREIGN PATENT DOCUMENTS

| | | |
|---|---|---|
| CN | 101009214 | 8/2007 |
| EP | 0687020 | 12/1995 |

(Continued)

OTHER PUBLICATIONS

Kolasinski, Kurt W., "Silicon Nanostructures from Electroless Electrochemical Etching," Current Opinion in Solid State and Materials Science, 9(1-2), (2005), pp. 73-83.

(Continued)

Primary Examiner — Caleb Henry
(74) Attorney, Agent, or Firm — Jones Day

(57) ABSTRACT

Nanostructured thermoelectric elements are made from planar uniwafer processing methods. The method includes producing either n-type or p-type thermoelectric uniwafer structure bearing nanostructure material embedded in a low thermal conductivity fill material. The method further includes partially cutting the uniwafer structure to form a plurality of chip structures separated by trenches. The method includes filling the trenches with the fill material to surround the nanostructure material within each chip structure. The method further includes additionally planar processing to form both frontend and backend conductive contact layers respectively coupled to frontend regions and backend regions of the chip structures. Additionally, the modified thermoelectric uniwafer structure is cut to turn the chip structures to bulk-sized nanostructured thermoelectric legs, each bulk-sized nanostructured thermoelectric leg being wrapped around by the fill material and ready for assembling thermoelectric modules.

19 Claims, 9 Drawing Sheets

(56) References Cited

U.S. PATENT DOCUMENTS

| | | | |
|---|---|---|---|
| 4,493,939 A | 1/1985 | Blaske et al. | |
| 5,391,914 A | 2/1995 | Sullivan et al. | |
| 5,824,561 A | 10/1998 | Kishi et al. | |
| 5,837,929 A | 11/1998 | Adelman | |
| 5,950,067 A | 9/1999 | Maegawa et al. | |
| 6,300,150 B1 | 10/2001 | Venkatasubramanian | |
| 6,843,902 B1 | 1/2005 | Penner et al. | |
| 6,882,051 B2 | 4/2005 | Majumdar et al. | |
| 6,894,215 B2 | 5/2005 | Akiba | |
| 6,996,147 B2 | 2/2006 | Majumdar et al. | |
| 7,267,859 B1 * | 9/2007 | Rabin et al. | 428/131 |
| 7,361,313 B2 | 4/2008 | Chan et al. | |
| 7,569,202 B2 | 8/2009 | Farrell et al. | |
| 7,605,327 B2 | 10/2009 | Roscheisen et al. | |
| 7,820,292 B2 | 10/2010 | Shcherbakov et al. | |
| 8,044,294 B2 | 10/2011 | Park et al. | |
| 8,729,381 B2 | 5/2014 | Yang et al. | |
| 8,736,011 B2 | 5/2014 | Yi et al. | |
| 2002/0175408 A1 | 11/2002 | Majumdar et al. | |
| 2003/0041892 A1 | 3/2003 | Fleurial et al. | |
| 2003/0099279 A1 | 5/2003 | Venkatasubramanian et al. | |
| 2003/0184188 A1 | 10/2003 | Kucherov et al. | |
| 2003/0189202 A1 | 10/2003 | Li et al. | |
| 2004/0000333 A1 | 1/2004 | Chen et al. | |
| 2004/0042181 A1 | 3/2004 | Nagasaki | |
| 2004/0106203 A1 | 6/2004 | Stasiak et al. | |
| 2004/0157354 A1 | 8/2004 | Kuriyama et al. | |
| 2004/0161369 A1 | 8/2004 | Chan et al. | |
| 2004/0251539 A1 * | 12/2004 | Faris et al. | 257/712 |
| 2004/0261830 A1 | 12/2004 | Sharp et al. | |
| 2005/0045702 A1 | 3/2005 | Freeman et al. | |
| 2005/0064185 A1 | 3/2005 | Buretea et al. | |
| 2005/0110064 A1 | 5/2005 | Duan et al. | |
| 2005/0112872 A1 | 5/2005 | Okamura | |
| 2005/0224790 A1 | 10/2005 | Jin et al. | |
| 2005/0241690 A1 | 11/2005 | Tajima et al. | |
| 2006/0000502 A1 | 1/2006 | Fiorini et al. | |
| 2006/0076046 A1 | 4/2006 | Ghoshal et al. | |
| 2006/0118158 A1 | 6/2006 | Zhang et al. | |
| 2006/0118513 A1 * | 6/2006 | Faure et al. | 216/33 |
| 2006/0151820 A1 | 7/2006 | Duan et al. | |
| 2006/0157101 A1 | 7/2006 | Sakamoto et al. | |
| 2006/0159916 A1 | 7/2006 | Dubrow et al. | |
| 2006/0172116 A1 | 8/2006 | Den et al. | |
| 2006/0233692 A1 | 10/2006 | Scaringe et al. | |
| 2006/0251561 A1 | 11/2006 | Farrell et al. | |
| 2006/0266402 A1 | 11/2006 | Zhang et al. | |
| 2007/0025658 A1 | 2/2007 | Fukai et al. | |
| 2007/0128773 A1 | 6/2007 | Baskaran | |
| 2007/0131269 A1 | 6/2007 | Dutta | |
| 2007/0132043 A1 | 6/2007 | Bradley et al. | |
| 2007/0261730 A1 | 11/2007 | Seker et al. | |
| 2008/0006843 A1 | 1/2008 | Dai et al. | |
| 2008/0060695 A1 | 3/2008 | Brignone | |
| 2008/0121263 A1 | 5/2008 | Schutte et al. | |
| 2008/0142066 A1 | 6/2008 | Plissonnier et al. | |
| 2008/0149914 A1 | 6/2008 | Samelson et al. | |
| 2008/0173344 A1 | 7/2008 | Zhang et al. | |
| 2008/0178920 A1 | 7/2008 | Ullo | |
| 2008/0178921 A1 | 7/2008 | Ye | |
| 2008/0230802 A1 * | 9/2008 | Bakkers et al. | 257/190 |
| 2008/0268233 A1 | 10/2008 | Lawin et al. | |
| 2008/0299381 A1 | 12/2008 | Zhang et al. | |
| 2008/0308140 A1 | 12/2008 | Nakamura | |
| 2009/0004086 A1 | 1/2009 | Kuhling et al. | |
| 2009/0020148 A1 | 1/2009 | Boukai et al. | |
| 2009/0096109 A1 | 4/2009 | Iwasaki | |
| 2009/0117741 A1 | 5/2009 | Heath et al. | |
| 2009/0140145 A1 | 6/2009 | Ouvrier-Buffet et al. | |
| 2009/0174038 A1 | 7/2009 | Wang | |
| 2009/0214848 A1 | 8/2009 | Sands | |
| 2009/0236317 A1 | 9/2009 | Yost et al. | |
| 2010/0068871 A1 | 3/2010 | Tian et al. | |
| 2010/0072461 A1 * | 3/2010 | Hannebauer | 257/30 |
| 2010/0078055 A1 | 4/2010 | Vidu et al. | |
| 2010/0147350 A1 | 6/2010 | Chou | |
| 2010/0147371 A1 | 6/2010 | Cho | |
| 2010/0162728 A1 | 7/2010 | Lee | |
| 2010/0233518 A1 | 9/2010 | Kwon et al. | |
| 2010/0236596 A1 | 9/2010 | Lee et al. | |
| 2010/0261013 A1 | 10/2010 | Duan et al. | |
| 2010/0272993 A1 | 10/2010 | Volinsky et al. | |
| 2010/0319759 A1 * | 12/2010 | Fisher et al. | 136/252 |
| 2011/0000708 A1 | 1/2011 | Nakai et al. | |
| 2011/0059568 A1 | 3/2011 | Chao et al. | |
| 2011/0065223 A1 * | 3/2011 | Hannebauer | 438/54 |
| 2011/0114145 A1 | 5/2011 | Yang et al. | |
| 2011/0114146 A1 * | 5/2011 | Scullin | 136/205 |
| 2011/0233512 A1 * | 9/2011 | Yang et al. | 257/9 |
| 2011/0266521 A1 * | 11/2011 | Ferrari et al. | 257/14 |
| 2011/0304004 A1 * | 12/2011 | Park | 257/467 |
| 2012/0049315 A1 * | 3/2012 | Kim et al. | 257/467 |
| 2012/0152295 A1 * | 6/2012 | Matus et al. | 136/200 |
| 2012/0247527 A1 * | 10/2012 | Scullin et al. | 136/227 |
| 2012/0282435 A1 | 11/2012 | Yang et al. | |
| 2012/0295074 A1 * | 11/2012 | Yi et al. | 428/195.1 |
| 2012/0319082 A1 * | 12/2012 | Yi et al. | 257/15 |
| 2013/0000688 A1 * | 1/2013 | Cho et al. | 136/200 |
| 2013/0019918 A1 * | 1/2013 | Boukai et al. | 136/238 |
| 2013/0037070 A1 * | 2/2013 | Narducci et al. | 136/203 |
| 2013/0042899 A1 * | 2/2013 | Wirtz et al. | 136/201 |
| 2013/0069194 A1 * | 3/2013 | Marinescu et al. | 257/467 |
| 2013/0081662 A1 * | 4/2013 | Dibra | 136/203 |
| 2013/0161834 A1 * | 6/2013 | Pan | 257/777 |
| 2013/0175654 A1 | 7/2013 | Muckenhirn et al. | |
| 2013/0186445 A1 * | 7/2013 | Lorimer et al. | 136/201 |
| 2013/0187130 A1 | 7/2013 | Matus et al. | |
| 2013/0241026 A1 * | 9/2013 | Or-Bach et al. | 257/506 |
| 2013/0267046 A1 * | 10/2013 | Or-Bach et al. | 438/14 |
| 2014/0024163 A1 * | 1/2014 | Aguirre et al. | 438/55 |
| 2014/0116491 A1 * | 5/2014 | Reifenberg et al. | 136/203 |
| 2014/0182644 A1 * | 7/2014 | Aguirre et al. | 136/200 |
| 2014/0193982 A1 | 7/2014 | Yi et al. | |
| 2014/0318593 A1 * | 10/2014 | Venkatasubramanian et al. | 136/238 |
| 2014/0329389 A1 | 11/2014 | Matus et al. | |

FOREIGN PATENT DOCUMENTS

| | | |
|---|---|---|
| EP | 1426756 | 6/2004 |
| JP | 2004-532133 | 10/2004 |
| JP | 2006-332188 | 12/2006 |
| JP | 5524839 | 4/2014 |
| RU | 2296055 | 11/2006 |
| WO | WO 00/08693 | 2/2000 |
| WO | WO 02/080280 | 10/2002 |
| WO | WO 2006/062582 | 6/2006 |
| WO | WO 2009/026466 | 2/2009 |
| WO | WO 2010/004550 | 1/2010 |
| WO | WO 2010/018893 | 2/2010 |

OTHER PUBLICATIONS

United States Patent and Trademark Office, Office Action issued in U.S. Appl. No. 13/430,558, mailed Apr. 24, 2014.

United States Patent and Trademark Office, Corrected Notice of Allowability issued in U.S. Appl. No. 13/308,945, mailed Apr. 24, 2014.

United States Patent and Trademark Office, Final Office Action issued in U.S. Appl. No. 13/364,176, mailed Sep. 8, 2014.

United States Patent and Trademark Office, Office Action issued in U.S. Appl. No. 14/203,360, mailed Jun. 10, 2014.

Asheghi et al., "Phonon-Boundary Scattering in Thin Silicon Layers," *Appl. Phys. Lett.*, 71(13) (1997), 1798-1800.

Asheghii et al., "Temperature-Dependent Thermal Conductivity of Single Crystal Silicon Layers in SOI Substrates," *J. Heat Transf.*, 120 (1998), pp. 30-36.

Brinson et al., "Thermal Conductivity and Thermoelectric Power of Heavily Doped N-Type Silicon," *J. Phys. C*, 3 (1970), pp. 483-491.

Cahill et al., "Thermal Conductivity of Amorphous Solids Above the Plateau," *Phys. Rev. B*, 35 (1987) pp. 4067-4073.

Chartier et al., "Metal-Assisted Chemical Etching of Silcon in $Hf-H_2O_2$," *Electrochmica Acta*, 53 (2008) pp. 5509-5516.

(56) References Cited

OTHER PUBLICATIONS

Chen et al., "Thermal Conductance of Thin Silicon Nanowires," *Physical Review Letters*, 101 (2008) pp. 105501-1-105501-4.
Chen et al., "Vertically-Aligned of Sub-Millimeter Ultralong Si Nanowire Arrays and Its Reduced Phonon Thermal Conductivity," *Journal of the Electrochemical Society*, 158:5 (2011) pp. D302-D306.
Chinese Patent Office, Office Action in CN Application No. 200880113050.3, mailed Aug. 26, 2013.
Chinese Patent Office, Office Action in CN Application No. 200880113050.3, mailed Mar. 5, 2013.
Chinese Patent Office, Office Action in CN Application No. 200880113050.3, mailed Oct. 24, 2011.
Chinese Patent Office, Office Action in CN Application No. 200880113050.3, mailed Sep. 5, 2012.
Disalvo, F.J., "Thermoelectric Cooling and Power Generation," *Science*, 285 (1999), 703-706.
Douani et al., "Formation of a-Si:H and a-$Si_{1-x}C_x$:H Nanowires by Ag-Assisted Electroless Etching in Aqueous $HF/AgNO_3$ Solution," *Thin Solid Films*, 519 (2011) pp. 5383-5387.
Electron Microscopy Sciences, Colloidal Compounds and Conductive Adhesives, Jan. 25, 2011; Retrieved on Aug. 13, 2012 from the Internet <URL: http://web.archive.org/web/20110125172854/http://emsdiasum.com/microscopy/products/sem/colloidal.aspx>. pp. 1-16.
Engineering Toolbox, "Thermal Conductivity of Metals," Engineering ToolBox.com [retrieved online on Jan. 22, 2014], from the Internet <URL: http://www.engineeringtoolbox.com/thermal-conductivity-metals-d_858.html>, pp. 1-8.
European Patent Office, Extended European Search Report for EP Application No. 10163141, mailed Aug. 20, 2013.
European Patent Office, Supplemental Search Report for EP Application No. 08827590, mailed Aug. 5, 2013.
Evanoff et al., "Synthesis and Optical Properties of Silver Nanoparticles and Arrays," *ChemPhysChem*, 6 (2005) pp. 1221-1231.
Fang et al., "Silver Catalysis in the Fabrication of Silicon Nanowire Arrays," *Nanotechnology*, 17 (2006) pp. 3768-3774.
Gao et al., "Selective Growth of Si Nanowire Arrays via Galvanic Displacement Processes in Water-in-Oil Microemulsions," *J. Am. Chem. Soc.*, 127 (2005) pp. 4574-4575.
Geballe et al., "Seebeck Effect in Silicon," *Phys. Rev.*, 98(4) (1955), pp. 940-947.
Gielis et al., "Silver-Assisted Electroless Etching of Si Nanowires," Abstract #1971, presented Oct. 11, 2010 at the 218th ECS Meeting (held in Las Vegas, NV, Oct. 10-15, 2010).
Harman et al., "Quantum Dot Superlattice Thermoelectric Materials and Evices," *Science*, 297 (2002), pp. 2229-2232.
Heitsch et al., *J. Am. Chem. Soc.*, 130 (2008) pp. 5436-5437.
Hochbaum et al., "Controlled Growth of Si Nanowire Arrays for Device Integration," *Nano Letters*, 5(3) (2005) pp. 457-460.
Hochbaum et al., "Enhanced Thermoelectric Performance of Rough Silicon Nanowires," *Nature*, 451 (2008) pp. 163-167 (with full Methods attached from on-line version of this paper at www.nature.com/nature).
Hochbaum et al., "Single Crystalline Mesoporous Silicon Nanowires," *Nano Letters*, 9(10) (2009) pp. 3550-3554.
Hsu et al., "Cubic $AgPb_mSbTe_{2+m}$: Bulk Thermoelectric Materials with High Figure of Merit," *Science*, 303 (2004), pp. 818-821.
Infineon, "Introduction to Power Dissipation and Thermal Resistance," Infineon.com [retrieved online on Jan. 22, 2014], from the Internet <URL: http://www.btipnow.com/events/ppt/Ch4%20Intro%20Power%20Diss%20Thermal%20Res.ppt>, pp. 1-67.
Japanese Patent Office, Office Action in JP Application No. 2010-522040, mailed Mar. 5, 2013.
Japanese Patent Office, Office Action in JP Application No. 2010-522040, mailed Oct. 15, 2013.
Ju et al., "Phonon Scattering in Silicon Films with Thickness of Order 100 nm," *Appl. Phys. Lett.*, 74(20) (1999), pp. 3005-3007.
Kim et al., "Thermal Conductivity Reduction and Thermoelectric Figure of Merit Increase by Embedding Nanoparticles in Crystalline Semiconductors," *Phys. Rev. Lett.*, 96 (2006), pp. 045901-1-045901-4.
Li et al., "Thermal Conductivity of Individual Silicon Nanowires," *Appl. Phys. Lett.*, 83(14) (2003), pp. 2934-2936.
Majumdar, A., "Thermoelectricity in Semiconductor Nanostructures," *Science*, 303 (2004), pp. 777-778.
Morinaga et al., "Mechanism of Metallic Particle Growth and Metal-Induced Pitting on Si Wafer Surface in Wet Chemical Process," *J. Electrochem. Soc.*, 141(10) (1994) pp. 2834-2841.
Nahm et al., "Mechanism of Silicon Etching in $Hf-KMnO_4-H_2O$ Solution," *Korean J. of Chem. Eng.*, 12(2) (1995) pp. 162-167.
Parkhutik, V.P., "Oscillations of Open-Circuit Potential During Immersion Plating of Silicon in $CuSo_4/Hf$ Solutions," *Russian Journal of Electrochemistry*, 42(5) (2006) pp. 512-522.
Patent Cooperation Treaty, International Search Report for application PCT/US2010/056356, mailed Jun. 3, 2011.
Patent Cooperation Treaty, International Search Report for application PCT/US2011/061301, mailed Jan. 31, 2013.
Patent Cooperation Treaty, International Search Report for application PCT/US2011/63000, mailed Apr. 3, 2012.
Patent Cooperation Treaty, International Search Report for application PCT/US2011/066108, mailed Apr. 26, 2012.
Patent Cooperation Treaty, International Search Report for application PCT/US2012/023425, mailed Sep. 4, 2012.
Patent Cooperation Treaty, International Search Report for application PCT/US2013/025060, mailed Apr. 15, 2013.
Patent Cooperation Treaty, International Search Report for PCT/US08/73922, mailed Dec. 23, 2008.
Patent Cooperation Treaty, Written Opinion for PCT/US08/73922, mailed Dec. 23, 2008.
Patent Cooperation Treaty, Written Opinion of the International Searching Authority for application PCT/US2010/056356, mailed Jun. 3, 2011.
Patent Cooperation Treaty, Written Opinion of the International Searching Authority for application PCT/US2011/061301, mailed Jan. 31, 2013.
Patent Cooperation Treaty, Written Opinion of the International Searching Authority for application PCT/US2011/63000, mailed Apr. 3, 2012.
Patent Cooperation Treaty, Written Opinion of the International Searching Authority for application PCT/US2011/066108, mailed Apr. 26, 2012.
Patent Cooperation Treaty, Written Opinion of the International Searching Authority for application PCT/US2012/023425, mailed Sep. 4, 2012.
Patent Cooperation Treaty, Written Opinion of the International Searching Authority for application PCT/US2013/025060, mailed Apr. 15, 2013.
Peng et al., "Aligned Single-Crystalline Si Nanowire Arrays for Photovoltaic Applications," *Small*, 1(11), (2005), pp. 1062-1067.
Peng et al., "Aligned Single-Crystalline Si Nanowire Arrays for Photovoltaic Applications," *Small*, 1(11), (2005), pp. 1062-1067, with three additional pages of "Supporting Information."
Peng et al., "Dendrite-Assisted Growth of Silicon Nanowires in Electroless Metal Deposition," *Advanced Functional Materials*, 13(2) (2003) pp. 127-132.
Peng et al., "Motility of Metal Nanoparticles in Silicon and Induced Anisotropic Silicon Etching," *Advanced Functional Materials*, 18 (2008) pp. 3026-3035.
Peng et al., "Synthesis of Large-Area Silicon Nanowire Arrays via Self-Assembling Nanoelectrochemistry," *Adv. Mater.*, 14(16) (2002) pp. 1164-1167.
Peng et al., "Uniform, Axial-Orientation Alignment of One-Dimensional Single-Crystal Silicon Nanostructure Arrays," *Angew. Chem. Int. Ed.*, 44 (2005) pp. 2737-2742.
Rokugawa et al., "An Etchant System, $Ag_2CrO_4$-Hf—$H_2O$, for Highly Aligned Si Nanowire Fabrication," *Journal of the Electrochemical Society*, 157(8) (2010), pp. K157-K161.
Ruf et al., "Thermal Conductivity of Isotopically Enriched Silicon," *Solid State Commun.*, 115 (2000), pp. 243-247.

(56) References Cited

OTHER PUBLICATIONS

Russian Patent Office, Office Action in RU Application No. 2010110307/04, mailed Jun. 1, 2012.
Russian Patent Office, Resolution on Granting Patent for Invention in RU Application No. 2010110307/04, mailed Sep. 11, 2013.
Rutten et al., "The Electrochemical Reduction of Nitrate in Acidic Nitrate Solutions," *Journal of Applied Electrochemistry*, 29 (1999) pp. 87-92.
Shi et al., "Measuring Thermal and Thermoelectric Properties of One-Dimensional Nanostructures Using a Microfabricated Device," *J. Heat Transf.*, 125 (2003), pp. 881-888.
Sivakov et al., "Realization of Vertical and Zigzag Single Crystalline Silicon Nanowire Architectures," *J. Phys. Chem. C*, 114 (2010) pp. 3798-3803.
Tang et al., "Holey Silicon as an Efficient Thermoelectric Material," *Nano Lett.*, 10 (2010), pp. 4279-4283.
Tao et al., "Langmuir-Blodgett Silver Nanowire Monolayers for Molecular Sensing Using Surface-Enhanced Raman Spectroscopy," *Nano. Lett.* 3, (2003), pp. 1229-1233.
United States Patent and Trademark Office, Advisory Action issued in U.S. Appl. No. 12/673,366, mailed Nov. 27, 2013.
United States Patent and Trademark Office, Notice of Allowance issued in U.S. Appl. No. 13/308,945, mailed Dec. 11, 2013.
United States Patent and Trademark Office, Office Action issued in U.S. Appl. No. 12/673,366, mailed May 1, 2013.
United States Patent and Trademark Office, Office Action issued in U.S. Appl. No. 12/673,366, mailed Sep. 26, 2013.
United States Patent and Trademark Office, Office Action issued in U.S. Appl. No. 12/943,134, mailed Nov. 18, 2013.
United States Patent and Trademark Office, Office Action issued in U.S. Appl. No. 13/308,945, mailed Aug. 2, 2013.
United States Patent and Trademark Office, Office Action issued in U.S. Appl. No. 13/364,176, mailed Jan. 27, 2014.
United States Patent and Trademark Office, Office Action issued in U.S. Appl. No. 13/760,977, mailed Apr. 1, 2014.
Van Herwaarden, A.W., "The Seebeck Effect in Silicon ICs.," *Sensors and Actuators*, 6 (1984), pp. 245-254.
Venkatasubramanian et al., "Thin-film Thermoelectric Devices with High Room-Temperature Figures of Merit," *Nature*, 413 (2001), pp. 597-602.
Wang et al., "Complementary Symmetry Silicon Nanowire Logic: Power-Efficient Inverters with Gain," *Small*, 2(10), (2006), pp. 1153-1158.
Weber et al., "Transport Properties of Silicon," *Appl. Phys. A.* 53, (1991), 136-140.
Weiss et al., "Nanoparticle-Textured Surfaces from Spin Coating," *Langmuir*, 24 (2008) pp. 5218-5220.
Wilson, "Thermal Conductivity of Solders," Electronics-cooling.com [retrieved online on Jan. 23, 2014], from the Internet <URL: http://www.electronics-cooling.com/2006/08/thermal-conductivity-of-solders/>, pp. 1-3.
Yoo et al., "Thermal Conductivity of Al2O3/Water Nanotluids," *Journal of the Korean Physical Society*, 51 (Oct. 2007), pp. S84-S87.
Zandi et al., "Study of Bulk Micromachining for <100> Silicon," *Eur. Phys. J. Appl. Phys.*, 35 (2006) pp. 7-12.
Zhang et al., "Synthesis of Ordered Single Crystal Silicon Nanowire Arrays," *Adv. Mater.*, 13 (2001), 1238.
Zou et al., "Phonon Heat Conduction in a Semiconductor Nanowire," *J. App. Phys.*, 89(5) (2001) pp. 2932-2938.
Bell, "Cooling, heating, generating power, and recovering waste heat with thermoelectric systems," Science, vol. 321, pp. 1457-1461, Sep. 12, 2008.
Ben-Chorin et al., "Hopping transport on a fractal: ac conductivity of porous silicon," Physical Review B, vol. 51, No. 4, pp. 2199-2213, Jan. 15, 1995.
Boukai et al, "Silicon nanowires as efficient thermoelectric materials," Nature, vol. 451, Jan. 10, 2000.
Bux et al., "Nanostructured bulk silicon as an effective thermoelectric material," Advanced Functional Materials 2009, 19, 2445-2452.
Cahill et al., "Lower limit to the thermal conductivity of disordered crystals," Physical Review B, vol. 46, No. 10, pp. 6131-6140, Sep. 1, 1992.
Cheng et al., "Fabrication of Vertically Aligned Silicon Nanowire Arrays and Investigation on the Formation of the Nickel Silicide Nanowires," presented at the 2007 IEEE Conference on Electron Devices and Solid-State Circuit held Dec. 20-22, 2007, *IEEE Service Center*, 2007, pp. 121-124.
Chiritescu et al., "Ultralow thermal conductivity in disordered, layered $WSe_2$ crystals," Science, vol. 315, pp. 351-353, Jan. 19, 2007.
Cui, "High performance silicon nanowire field effect transistors," Nano Letters, 2003, vol. 3, No. 2 pp. 149-152, Nov. 1, 2002.
Gesele et al., "Temperature-dependent thermal conductivity of porous silicon," J. Phys. D: Appl. Phys. 30 (1997) 2911-2916, May 19, 1997.
Haick et al., "Electrical characteristics and chemical stability of non-oxidized, methyl-terminated silicon nanowires," J. Am. Chem. Soc. 2006, 128, 8990-8991, Oct. 4, 2005.
Hao et al., "Frequency-dependent Monte Carlo simulations of phonon transport in two-dimensional porous silicon with aligned pores," Journal of Applied Physics 106, 114321 (2009), Dec. 15, 2009.
Kim et al., "Thermal Transport Properties of Thin Films of Small Molecule Organic Semiconductors," Applied Physics Letters, 87: 241908 (2005), 3 pages.
Majumdar, A., "Lower limit of thermal conductivity: diffusion versus localization," Technical Discussion, Microscale Thermophysical Engineering, 2:5-9, 1998, © 1998 Taylor & Francis 1089-3954/98.
Mathur et al., "Thermoelectric power in porous silicon," Journal of Applied Physics, vol. 83, No. 11, pp. 5855-5857, Jun. 1, 1998.
Park et al., "Fabrication of highly ordered silicon oxide dots and stripes from block copolymer thin films," Advanced Materials 2008, 20, 681-685.
Snyder et al., "Complex thermoelectric materials," Nature Materials, vol. 7, pp. 105-112, Feb. 2008.
Swartz et al., "Thermal boundary resistance," Reviews of Modern Physics, vol. 61, No. 3, pp. 605-668, Jul. 1989.
Tang et al., "Holey Silicon as an Efficient Thermoelectric Material JIB-2854," abstract, Lawrence Berkeley National Laboratory, Apr. 8, 2011. Downloaded from http://lbl.gov.Tech-Transfer/techs/1bn12854.html on Apr. 14, 2011 (one page).
Tritt et al., "Thermoelectrics: Direct solar thermal energy conversion," MRS Bulletin, vol. 33, Apr. 2008.
Vazquez-Mena et al., "Metallic nanowires by full wafer stencil lithography," Nano Letters, 2008, vol. 8, No. 11, 3675-3682, Aug. 11, 2008.
Wang et al., "A New Type of Low Power Thermoelectric Micro-Generator Fabricated by Nanowire Array Thermoelectric Material," *Microelectronic Engineering*, 77(3-4): 223-229 (Apr. 1, 2005).
Yamamoto et al., "Thermoelectric transport properties of porous silicon nanostructure," 18th International Conference on Thermoelectrics (1999), © 2000 IEEE 0-7803-5451-6/00.
Yang et al., "Thermoelectric materials for space and automotive power generation," MRS Bulletin, vol. 31, pp. 224-229, Mar. 2006.
European Patent Office, Extended European Search Report for EP Application No. 11845164.0, mailed Nov. 6, 2014.
European Patent Office, Extended European Search Report for EP Application No. 11841453.1, mailed Nov. 28, 2014.
United States Patent and Trademark Office, Office Action issued in U.S. Appl. No. 12/943,134, mailed May 22, 2014.
United States Patent and Trademark Office, Office Action issued in U.S. Appl. No. 12/943,134, mailed Jan. 21, 2015.
United States Patent and Trademark Office, Office Action issued in U.S. Appl. No. 13/331,768, mailed Jan. 20, 2015.
United States Patent and Trademark Office, Office Action issued in U.S. Appl. No. 13/760,977, mailed Dec. 2, 2014.
United States Patent and Trademark Office, Office Action issued in U.S. Appl. No. 13/947,400, mailed Oct. 3, 2014.
United States Patent and Trademark Office, Notice of Allowance issued in U.S. Appl. No. 13/786,090, mailed Oct. 9, 2014.
United States Patent and Trademark Office, Notice of Allowance issued in U.S. Appl. No. 14/203,360, mailed Sep. 18, 2014.

(56) References Cited

OTHER PUBLICATIONS

United States Patent and Trademark Office, Office Action issued in U.S. Appl. No. 14/203,360, mailed Jan. 26, 2015.

Masetti et al., "Modeling of Carrier Mobility Against Carrier Concentration in Arsenic-, Phosphorus-, and Boron-Doped Silicon," IEEE Transactions on Electron Device, 30(7):764-769 (1983).

European Patent Office, Extended European Search Report for EP Application No. 10830715.8, mailed Jun. 10, 2014.

United States Patent and Trademark Office, Notice of Allowance issued in U.S. Appl. No. 13/786,090, mailed Feb. 9, 2015.

United States Patent and Trademark Office, Office Action issued in U.S. Appl. No. 13/430,558, mailed Jan. 30, 2015.

United States Patent and Trademark Office, Office Action issued in U.S. Appl. No. 13/299,179, mailed Feb. 26, 2015.

United States Patent and Trademark Office, Office Action issued in U.S. Appl. No. 13/364,176, mailed Apr. 29, 2015.

United States Patent and Trademark Office, Notice of Allowance issued in U.S. Appl. No. 13/947,400, mailed Mar. 24, 2015.

United States Patent and Trademark Office, Corrected Notice of Allowability issued in U.S. Appl. No. 13/786,090, mailed Mar. 3, 2015.

United States Patent and Trademark Office, Notice of Allowance issued in U.S. Appl. No. 14/333,197, mailed May 1, 2015.

* cited by examiner

NANOSTRUCTURED THERMOLECTRIC ELEMENTS AND METHODS OF MAKING THE SAME

CROSS-REFERENCES TO RELATED APPLICATIONS

This application claims priority of U.S. Provisional Patent Application No. 61/718,572, filed on Oct. 25, 2012, commonly assigned, and hereby incorporated by reference in its entirety herein for all purposes.

This application is also related to U.S. patent application Ser. Nos. 13/299,179, 13/308,945, and 13/331,768, commonly assigned, and hereby incorporated by references in their entireties herein for all purposes.

BACKGROUND OF THE INVENTION

The present invention is directed to thermoelectric structure and method of making the same. More particularly, the invention provides a method for the manufacture of nanostructured thermoelectric elements. Merely by way of an example, the method has been applied to uniwafer backend processing for forming a plurality of thermoelectric legs based on nanowires in a single silicon wafer. It would be recognized that the invention has a much broader range of applicability.

To date, thermoelectrics have had limited commercial applicability due to the poor cost performance of these devices compared to other technologies that accomplish similar means of energy generation or refrigeration. Where other technologies usually are not as suitable as thermoelectrics for using in lightweight and low footprint applications, thermoelectric devices often have nonetheless been limited by their prohibitively high costs. Important in realizing the usefulness of thermoelectrics in commercial applications is the manufacturability of devices that comprise high-performance thermoelectric materials (e.g., modules). These modules are preferably produced in such a way that ensures, for example, maximum performance at minimum cost.

The thermoelectric materials in presently available commercial thermoelectric modules are generally comprised of bismuth telluride or lead telluride, which are both toxic, difficult to manufacture with, and expensive to procure and process. With a strong present need for both alternative energy production and microscale cooling capabilities, the driving force for highly manufacturable, low cost, high performance thermoelectrics is growing.

Thermoelectric devices are often divided into thermoelectric legs made by conventional thermoelectric materials such as $Bi_2Te_3$ and PbTe, contacted electrically, and assembled in a refrigeration (e.g., Peltier) or energy conversion (e.g., Seebeck) device. This often involves bonding the thermoelectric legs to metal contacts in a configuration that allows a series-configured electrical connection while providing a thermally parallel configuration, so as to establish a temperature gradient across all the legs simultaneously. However, many drawbacks may exist in the production of conventional thermoelectric devices. For example, costs associated with processing and assembling the thermoelectric legs made externally is often high. The conventional processing or assembling method usually makes it difficult to manufacture compact thermoelectric devices needed for many thermoelectric applications. Conventional thermoelectric materials are usually toxic and expensive.

Nanostructures often refer to structures that have at least one structural dimension measured on the nanoscale (e.g., between 0.1 nm and 1000 nm). For example, a nanowire is characterized as having a cross-sectional area that has a distance across that is measured on the nanoscale, even though the nanowire may be considerably longer in length. In another example, a nanotube, or hollow nanowire, is characterized by having a wall thickness and total cross-sectional area that has a distance across that is measured on the nanometer scale, even though the nanotube may be considerably longer in length. In yet another example, a nanohole is characterized as a void having a cross-sectional area that has a distance across that is measured on the nanoscale, even though the nanohole may be considerably longer in depth. In yet another example, a nanomesh is an array, sometimes interlinked, including a plurality of other nanostructures such as nanowires, nanotubes, and/or nanoholes.

Nanostructures have shown promise for improving thermoelectric performance. The creation of 0D, 1D, or 2D nanostructures from a thermoelectric material may improve the thermoelectric power generation or cooling efficiency of that material in some instances, and sometimes very significantly (a factor of 100 or greater) in other instances. However, many limitations exist in terms of alignment, scale, and mechanical strength for the nanostructures. Processing such nanostructures using methods that are similar to the processing of silicon would have tremendous cost advantages. For example, creating nanostructure arrays in a wafer with long uniform lengths ending with planar frontend surfaces can be utilized in planar semiconductor processes. The processes may include etching the bulk-like wafer to from arrays of nanowires, filling a matrix material to embed the arrays of nanowires, and performing end-region metallization of the nanowires, and more. Eventually, processing the nanostructure arrays in these planar processes is aimed to cause a formation of a plurality of nanostructured thermoelectric legs configured for assembling an actual macroscopic thermoelectric device with greatly improved thermoelectric performance.

Nanostructure arrays, including nanowires, nanotubes, nanoholes, or a mesh network of above nanostructures, can be fabricated directly out of a silicon wafer material. For example, arrays of nanowires are formed substantially vertically into a thickness of the silicon wafer up to 400 microns or greater. More details about formation of arrays of long nanostructures in semiconductor materials and methods thereof can be found in U.S. patent application Ser. No. 13/299,179 filed Nov. 17, 2011 commonly assigned to Alphabet Energy, Inc. Hayward, Calif., incorporated as references for all purposes. It is desirable to transform these special nanostructure arrays into high performance thermoelectric (TE) elements by utilizing the high electrical conductance and low thermal conductance functionalities of the long nanowires to give a high thermoelectric figure of merit ZT value. The ultimate commercial performance, and therefore usefulness, of a power generation thermoelectric is governed by its cost-per-Watt. It is beneficial to process a single piece of material, for example, a silicon wafer, in such a fashion as its use as a thermoelectric is maximized, since processing steps for most two-dimensional semiconductor material or the like cost the same amount regardless of the material thickness.

Particularly in an embodiment, the arrays of SiNW can be doped either in n or p-type with a doping level up to $10^{20}$ $CM^{-3}$ to push up the electrical conductivity and its thermal conductivity is substantially reduced or limited by the extreme small cross section area for these nanowires with aspect ratio of about 100 to 1, or even 1000:1. In another embodiment, the arrays of SiNW on silicon wafer, a so-called SiNWs on uniwafer structure, are embedded into a dielectric fill material that bears a high dielectric constant and substantially low thermal conductivity. More details on methods for embedding Si nanowire arrays into a matrix of fill material for forming thermoelectric elements can be found in U.S. patent application Ser. No. 13/308,945 filed Dec. 1, 2011, commonly assigned to Alphabet Energy, Inc. of Hayward, Calif., incorporated as references for all purposes. However, provided with a thermoelectric uniwafer structure with the arrays of SiNW embedded in a matrix of fill material in a silicon wafer, further processes on transferring the SiNWs on uniwafer structures to useful bulk-sized thermoelectric legs for the manufacture of thermoelectric devices are still scarce and desired.

From the above, it is seen that improved techniques for manufacturing thermoelectric device based on SiNWs on uniwafers are desired.

BRIEF SUMMARY OF THE INVENTION

The present invention is directed to thermoelectric structure and method of making the same. More particularly, the invention provides a method for the manufacture of nanostructured thermoelectric elements. Merely by way of an example, the method has been applied to uniwafer backend processing for forming a plurality of thermoelectric legs based on nanowires in a single silicon wafer. It would be recognized that the invention has a much broader range of applicability.

In a specific embodiment, the present invention provides a method for fabricating a plurality of bulk-sized thermoelectric legs by uniwafer process. The method includes providing a wafer substrate comprising nanostructured material formed from a front surface into a first depth of a partial thickness of the wafer. The method further includes cutting the wafer from the front surface into a second depth of the wafer to define a plurality of nanostructured units separated by trenches. The second depth is a partial thickness of the wafer and is slightly greater than the first depth. Additionally, the method includes filling the trenches with a non-conductive material to above the front surface and polishing the front surface to remove extra non-conductive material and expose a front end region of each of the plurality of nanostructured units, followed by metalizing the front end region of each of the plurality of nanostructured units. The method further includes forming a first conductive layer overlying the front surface including areas of the metalized front end regions and surface area of the non-conductive material and bonding a carrier wafer to the first conductive layer. Furthermore, the method includes lapping from a back surface of the wafer substrate until the non-conductive material is exposed at regions where the trenches are located and remaining regions of remained wafer substrate for respectively connecting the plurality of nanostructured units. The method also includes forming a second conductive layer overlying the entire back surface to form electrical contacts respectively with the remaining regions connecting to the plurality of nanostructured units, attaching a carrier tape to the second conductive layer, and debonding the carrier wafer from the first conductive layer. Moreover, the method includes cutting from the first conductive layer with alignment into the vicinity of the filled trenches substantially through all materials except the carrier tape such that the plurality of nanostructured units is individually separated and respectively wrapped around by a remaining thickness of non-conductive material.

In another specific embodiment, the present invention provides a method for fabricating a plurality of bulk-sized thermoelectric legs by uniwafer process. The method includes providing a wafer substrate comprising nanostructured material formed from a front surface into a first depth of the wafer and cutting the wafer from the front surface into a second depth of the wafer to form a plurality of first trenches to separate a plurality of nanostructured units. The second depth is slightly greater than the first depth as a partial thickness of the wafer. The method further includes filling the plurality of first trenches with a non-conductive material to above the front surface, polishing the front surface to remove extra non-conductive material and expose a front end region of each nanostructured unit, and metalizing the front end region of each nanostructured unit. Additionally, the method includes forming a first metal layer overlying the front surface including each metalized front end region and the non-conductive material and bonding a conductive contact plate to the first metal layer. The method also includes lapping from a back surface of the wafer substrate until the non-conductive material is exposed at regions corresponding to the plurality of first trenches for separating the plurality of nanostructured units and remaining regions of remained wafer substrate for respectively connecting the plurality of nanostructured units. Furthermore, the method includes forming a second metal layer overlying the back surface to form electrical contacts with the remaining regions respectively connecting the plurality of nanostructured units. Moreover, the method includes attaching a carrier tape to the second metal layer and cutting from the conductive contact plate with vertical alignment along edge vicinity of all the plurality of first trenches to from a plurality of second trenches with depths further through the filled non-conductive material and the wafer substrate to cause the plurality of nanostructured units to be isolated except being still attached to the carrier tape via the second metal layer.

In yet another specific embodiment, a method for fabricating a plurality of bulk-sized thermoelectric legs by uniwafer process is provided. The method includes providing a wafer substrate comprising nanostructured material formed from a front surface into a partial thickness of the wafer and forming trenches into the nanostructuerd material to define multiple nanostructured units. The trenches having a depth being slightly greater than the partial thickness associated with the nanostructured material. The method further includes filling the trenches with a non-conductive material to above the front surface, polishing the front surface to remove extra non-conductive material and expose each front end region of each one of the multiple nanostructured units, and metalizing the front end region of each one of the multiple nanostructured units. Additionally, the method includes forming a metal layer overlying the front surface including the metalized front end regions and the non-conductive material and bonding a carrier wafer to the metal layer. The method further includes lapping from a back surface of the wafer substrate to expose the non-conductive material within regions aligned to the trenches and keeping remained pieces of wafer substrate within remaining regions of the back surface connecting the multiple nanostructured units. Furthermore, the method includes forming a conductive contact layer overlying the back surface to form electrical contacts with the remaining regions respectively connecting the multiple nanostructured units, bonding a flexible substrate to the conductive contact layer, and debonding the carrier wafer to expose the metal layer. Moreover, the method includes cutting from the metal layer with vertical alignment along edge vicinity of all trenches through the filled non-conductive material and the wafer substrate to cause the multiple nanostructured units to be isolated and remained attaching to the flexible substrate, each nanostructured unit being individually wrapped by a remaining thickness of non-conductive material.

In another embodiment, the method further comprises picking up each isolated nanostructured unit from the flexible substrate or a carrier tape to produce a bulk-sized nanostructured thermoelectric leg bearing a p-type or n-type characteristic same as the wafer substrate. Alternatively, the method further comprises cutting the flexible substrate including a portion of the multiple nanostructured units being attached thereon into a stripe shape for facilitating application with a bended shape.

After the formation of the plurality of bulk-sized thermoelectric legs, make each thermoelectric leg accessible for being picked up, transferred, and rearranged on a solid base for the manufacture of a thermoelectric module, in which the solid base is served as a thermal contact for coupling with a surface region of a thermal source. An alternative method is to use a flexible substrate within the process of formation of the plurality of bulk-sized thermoelectric legs while keeping the plurality of the thermoelectric legs in an array on the flexible substrate, which further is directly used for attaching with a shaped surface region of a thermal source. Detail descriptions and examples of nanostructured thermoelectric elements and methods thereof are presented throughout this specification and particularly below.

DETAILED DESCRIPTION OF THE INVENTION

The present invention is directed to thermoelectric structure and method of making the same. More particularly, the invention provides a method for the manufacture of nanostructured thermoelectric elements. Merely by way of an example, the method has been applied to uniwafer backend processing for forming a plurality of thermoelectric legs based on nanowires in a single silicon wafer. It would be recognized that the invention has a much broader range of applicability.

After the formation of the various type nanostructure arrays, including nanowires, nanotubes, nanoholes, or a mesh network of above nanostructures, filled with a matrix of low-thermal conductivity fill material embedded in a silicon wafer, the overall structure remains a single wafer. Thus, planar silicon wafer processing technology may be borrowed in certain aspects to manufacture a plurality of bulk-sized thermoelectric legs out of this uniwafer structure. Several methods are introduced in terms of flow charts as explained in detail below.

Figure 1:
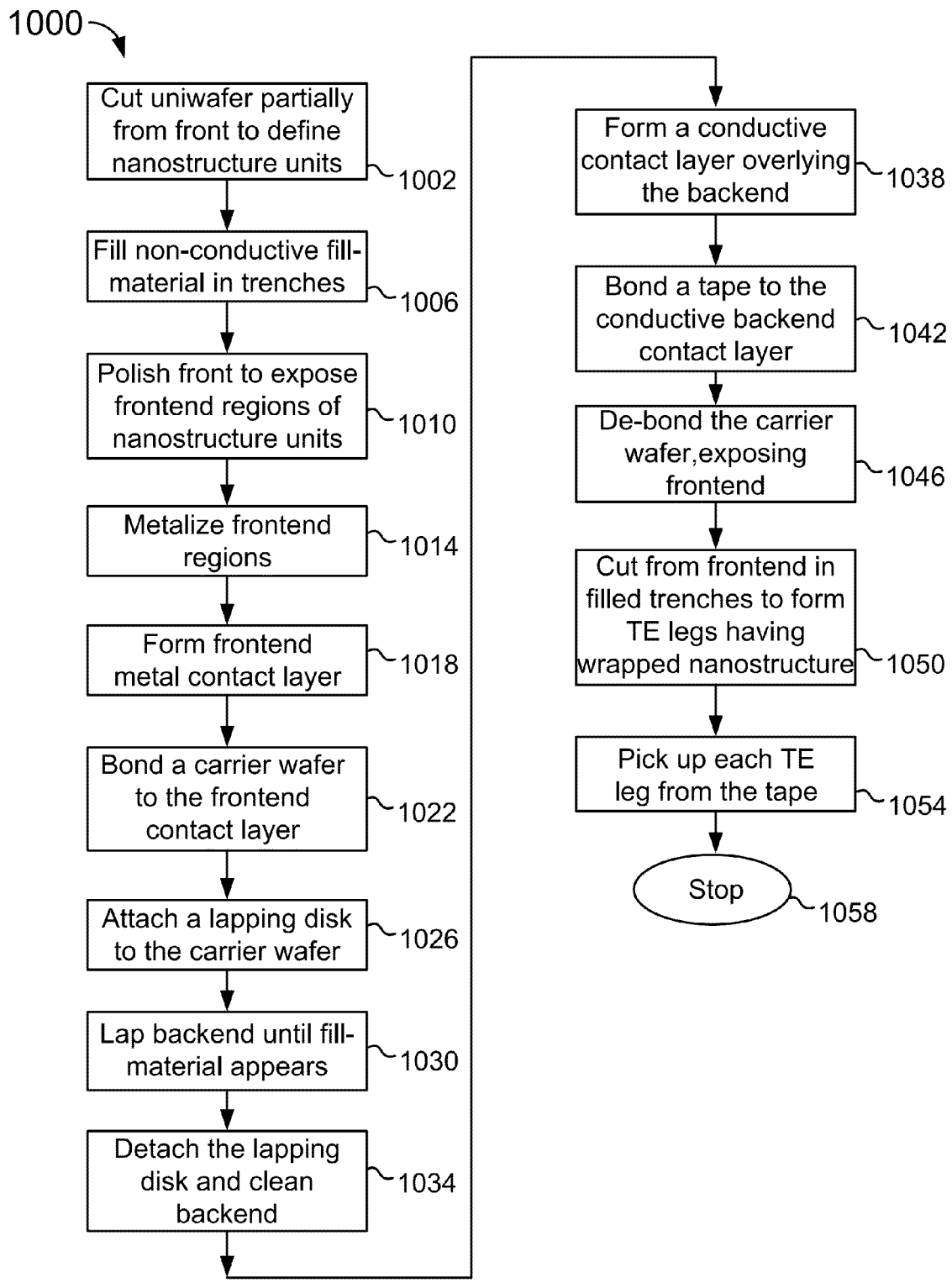
FIG. 1 is a chart showing a method for manufacturing a plurality of bulk-sized thermoelectric legs from an nanostructured thermoelectric uniwafer structure according to an embodiment of the present invention.

FIG. 1 is a chart showing a method with a flow of processes for manufacturing a plurality of bulk-sized thermoelectric legs from an nanostructured thermoelectric uniwafer structure according to an embodiment of the present invention. This diagram is merely an example, which should not unduly limit the scope of the claims. One of ordinary skill in the art would recognize many variations, alternatives, and modifications. In general, a uniwafer structure bearing nanostructured array of thermoelectric materials is prepared by transforming a partial thickness from a front surface of a semiconductor wafer into a nanostructured structure in any form (nanowire, nanohole, nanomesh, nanotube, or various combinations of two or more above forms) while keeping the rest thickness down to a backend surface of the wafer in an original form (a solid semiconductor). The wafer by itself can be optionally doped as either p-type or n-type electrical characteristics. The partial thickness of the nanostructure material comprises half or more than half of the total thickness of the semiconductor wafer and the thickness of the nanostructure material is substantially uniform with a variation margin within 50 microns or less. In an example, the nanostructured thermoelectric uniwafer structure can be provided as a plurality of SiNW arrays formed in a partial thickness of a doped Si wafer wherein the plurality of SiNW arrays is embedded by a fill material matrix. Provided by the uniwafer structure with embedded nanostructure arrays, a method 1000 for manufacturing a plurality of bulk-sized nanostructured thermoelectric legs is summarized by a series of processes listed below:

1. Process 1002 for cutting from a front surface partially into an nanostructured thermoelectric uniwafer structure to define multiple units of nanostructure material separated by trenches;
2. Process 1006 for adding a fill material into the trenches up to the front surface;
3. Process 1010 for polishing the front surface to expose a frontend region of nanostructure material in each unit;
4. Process 1014 for metalizing the frontend regions of all units of the nanostructure material;
5. Process 1018 for forming a frontend metal contact layer overlying all the metalized frontend regions;
6. Process 1022 for bonding a carrier wafer to the frontend metal contact layer;
7. Process 1026 for attaching a lapping disk to the carrier wafer;
8. Process 1030 for lapping a back surface of the nanostructured thermoelectric uniwafer structure until the fill material appears, the fill material surrounding each unit of the nanostructure material exposing a backend region;
9. Process 1034 for detaching the lapping disk and cleaning the back surface including the exposed backend regions;
10. Process 1038 for forming a conductive backend layer overlying the back surface to substantially couple all backend regions of the units of nanostructure material;
11. Process 1042 for bonding a carrier tape to the conductive backend layer;
12. Process 1046 for debonding the carrier wafer from the frontend metal contact layer;
13. Process 1050 for cutting through from the frontend metal contact layer into the filled trenches till reaching the carrier tape to form multiple bulk-sized thermoelectric (TE) legs separated by a second width;
14. Process 1054 for picking up individual bulk-sized TE legs from the carrier tape;

15. 1058: Stop.

The above sequence of processes provides a method for forming individual bulk-sized TE legs from a nanostructured thermoelectric uniwafer structure comprising a thickness of pre-fabricated nanostructured array material according to an embodiment of the present invention. One advantage of the method lies in the incorporation of planar semiconductor processing techniques to both the frontend and backend processing to achieve great cost savings. Other advantages of the method lead to the strengthening of the nanostructured TE legs each of which is wrapped around by the fill material and ready for module assembly. Other alternatives can also be provided where certain processes are added, one or more processes are removed, or one or more processes are provided in a different sequence without departing from the scope of the claims herein.

Figure 2:
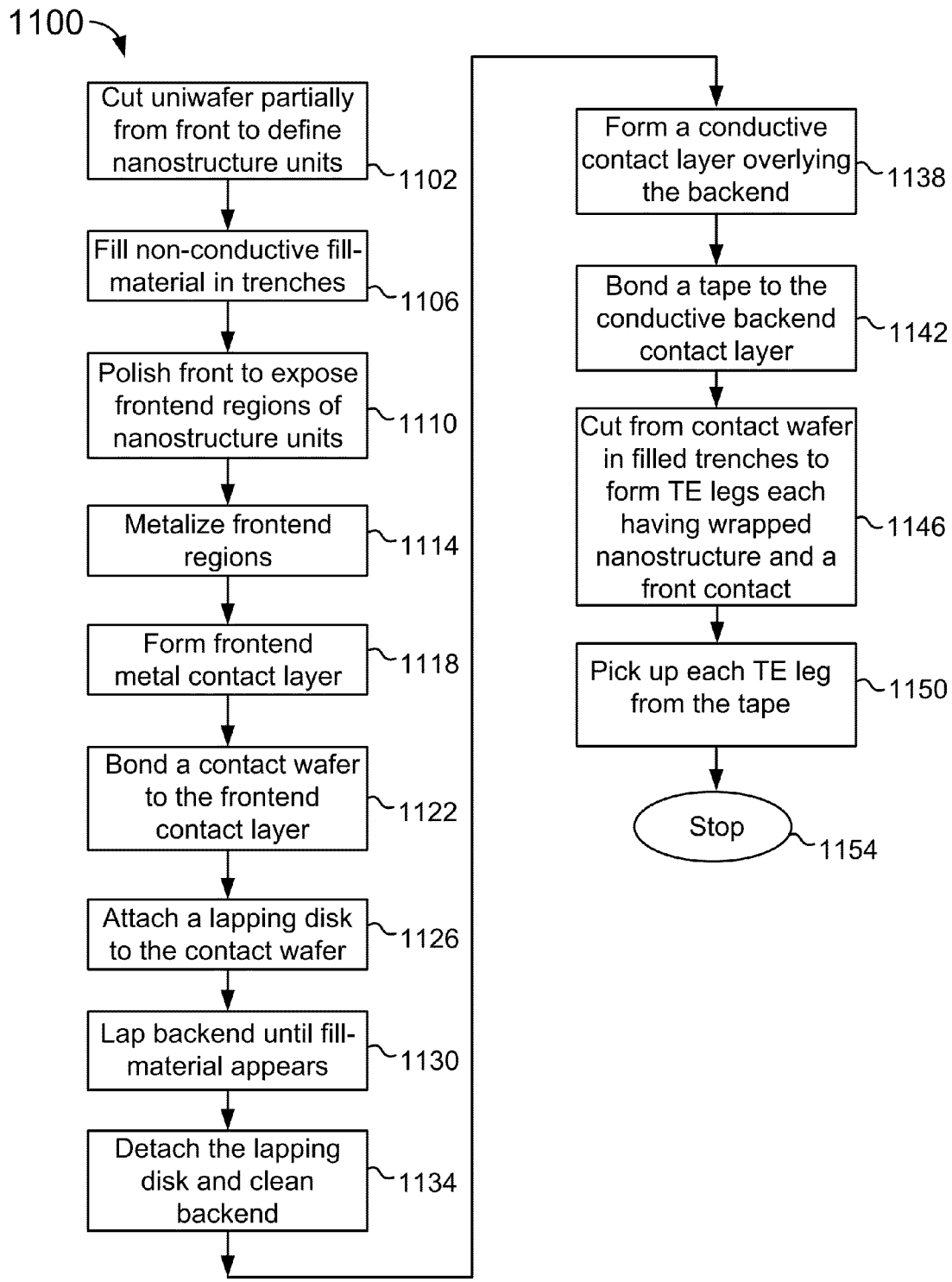
FIG. 2 is a chart showing a method for manufacturing a plurality of bulk-sized thermoelectric legs from an nanostructured thermoelectric uniwafer structure according to an alternative embodiment of the present invention.

FIG. 2 is a chart showing a method with a flow of processes for manufacturing a plurality of bulk-sized thermoelectric legs from an nanostructured thermoelectric uniwafer structure according to an alternative embodiment of the present invention. This diagram is merely an example, which should not unduly limit the scope of the claims. One of ordinary skill in the art would recognize many variations, alternatives, and modifications. A semiconductor wafer structure, doped with either an n-type or p-type dopant material, is provided with pre-fabricated (for example by etching) nanostructure layer occupying partial thickness of the whole wafer structure. As shown, based on this nanostructured uniwafer, a method 1100 for manufacturing a plurality of bulk-sized nanostructured thermoelectric legs is summarized by a series of processes listed below:

1. Process 1102 for defining multiple units of nanostructure material by forming trenches in a front surface of an nanostructured thermoelectric uniwafer structure;
2. Process 1106 for adding a fill material into the trenches up to the front surface;
3. Process 1110 for polishing the front surface to expose a frontend region of nanostructure material in each unit;
4. Process 1114 for metalizing the frontend regions of all units of the nanostructure material;
5. Process 1118 for forming a frontend metal contact layer overlying all the metalized frontend regions;
6. Process 1122 for bonding a contact wafer to the frontend metal contact layer;
7. Process 1126 for attaching a lapping disk to the contact wafer;
8. Process 1130 for lapping a back surface of the nanostructured thermoelectric uniwafer structure until the fill material appears, the fill material surrounding each unit of the nanostructure material with an exposed backend region;
9. Process 1134 for detaching the lapping disk and cleaning the back surface including the exposed backend regions;
10. Process 1138 for forming a conductive backend layer overlying the back surface to substantially couple all backend regions of the units of nanostructure material;
11. Process 1142 for bonding a carrier tape to the conductive backend layer;
12. Process 1146 for cutting from the contact wafer through the frontend metal contact layer into the filled trenches till reaching the carrier tape to form multiple bulk-sized TE legs separated by a second width;
13. Process 1150 for picking up individual bulk-sized TE legs including a frontend contact from the carrier tape;
14. 1154: Stop.

The above sequence of processes provides a method for forming individual bulk-sized thermoelectric legs from a uniwafer structure comprising a thickness of pre-fabricated nanostructured arrays material according to an alternative embodiment of the present invention. One advantage of the method lies in the incorporation of planar semiconductor processing techniques to both the frontend and backend processing to achieve great cost savings. Other advantages of the method lead to the strengthening of the nanostructure thermoelectric legs each of which is wrapped around by the fill material and each thermoelectric leg is made ready for direct module assembly. Other alternatives can also be provided where certain processes are added, one or more processes are removed, or one or more processes are provided in a different sequence without departing from the scope of the claims herein.

Figure 3:
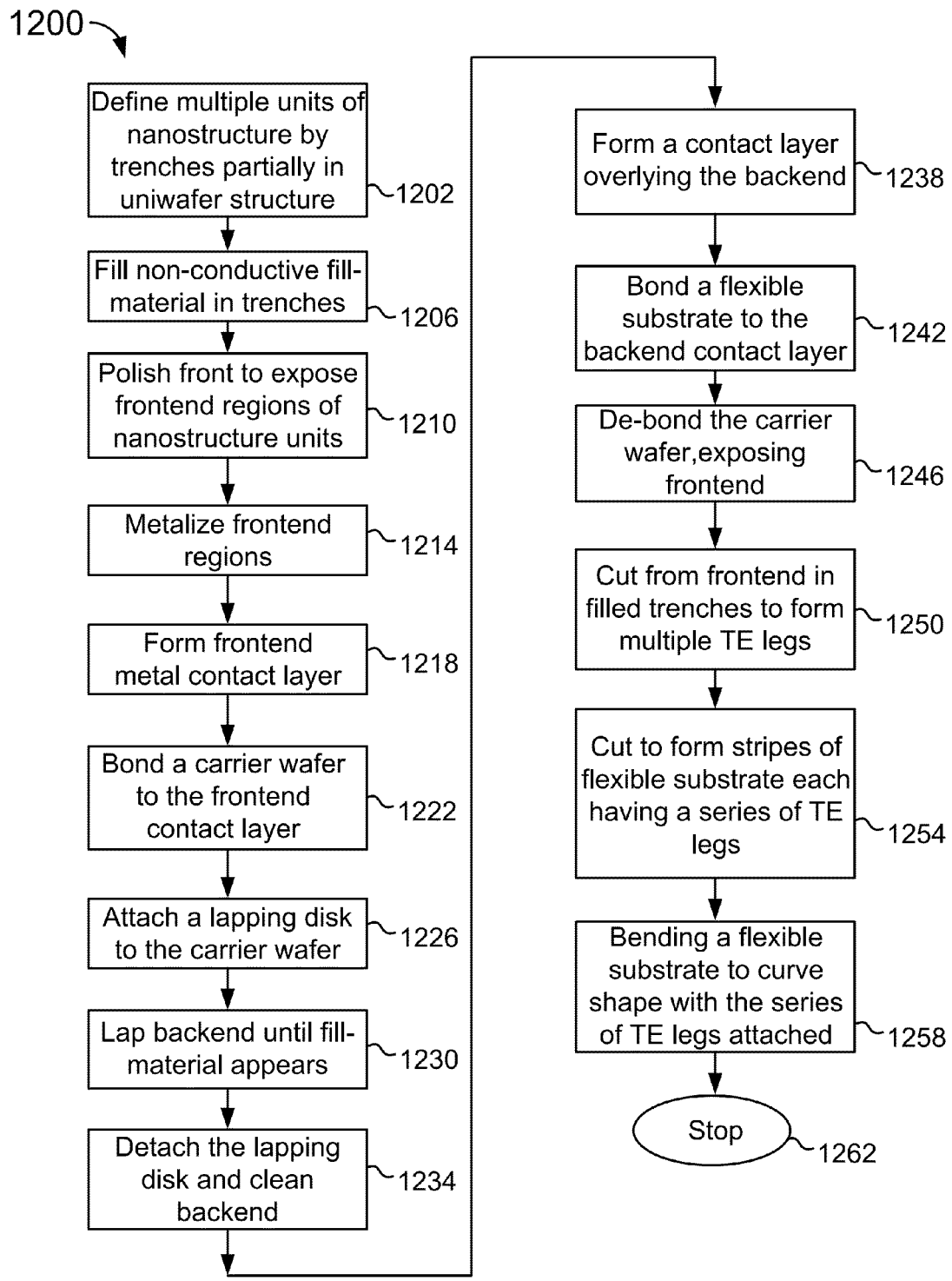
FIG. 3 is a chart showing a method for manufacturing a plurality of bulk-sized thermoelectric legs from an nanostructured thermoelectric uniwafer structure according to another alternative embodiment of the present invention.

FIG. 3 is a chart showing a method with a flow of processes for manufacturing a plurality of bulk-sized thermoelectric legs from an nanostructured thermoelectric uniwafer structure according to another alternative embodiment of the present invention. This diagram is merely an example, which should not unduly limit the scope of the claims. One of ordinary skill in the art would recognize many variations, alternatives, and modifications. As shown, a method 1200 for manufacturing a plurality of bulk-sized nanostructured thermoelectric legs based on a nanostructured uniwafer is summarized by a series of processes listed below:

1. Process 1202 for defining multiple units of nanostructure material by forming trenches in a front surface of an nanostructured thermoelectric uniwafer structure;
2. Process 1206 for adding a fill material into the trenches up to the front surface;
3. Process 1210 for polishing and etching the front surface to expose a frontend region of nanostructure material in each unit;
4. Process 1214 for metalizing the frontend regions of all units of the nanostructure material;
5. Process 1218 for forming a frontend metal contact layer overlying all the metalized frontend regions;
6. Process 1222 for bonding a carrier wafer to the frontend metal contact layer;
7. Process 1226 for attaching a lapping disk to the carrier wafer;
8. Process 1230 for lapping a back surface of the nanostructured thermoelectric uniwafer structure until the fill material appears, the fill material surrounding each unit of the nanostructure material with an exposed backend region;
9. Process 1234 for detaching the lapping disk and cleaning the back surface including the exposed backend regions;
10. Process 1238 for forming a conductive backend layer overlying the back surface to substantially couple all backend regions of the units of nanostructure material;
11. Process 1242 for bonding a flexible substrate to the conductive backend layer;
12. Process 1246 for de-bonding the carrier wafer from the frontend metal contact layer;
13. Process 1250 for cutting through the frontend metal contact layer into the filled trenches till reaching the flexible substrate to form multiple bulk-sized TE legs separated by a second width;
14. Process 1254 for cutting to form stripes of the flexible substrate each having a series of bulk-sized TE legs attached;
15. Process 1258 for bending the stripe of flexible substrate into a curved shape with all the series of bulk-sized TE legs remaining attached;
16. 1262: Stop.

The above sequence of processes provides a method for forming a series of bulk-sized thermoelectric legs from a nanostructured thermoelectric uniwafer structure formed on a stripe of flexible substrate according to another alternative embodiment of the present invention. One advantage of the method lies in the incorporation of planar semiconductor processing techniques to both the frontend and backend processing to achieve great cost savings. Other advantages of the method lead to the strengthening of the nanostructure thermoelectric legs each of which is wrapped around by the fill material. Provided with a flexible substrate such as metal foil in a stripe shape with a series of TE legs separately attached thereon, the method leads to a structure for conveniently install thermoelectric modules with high performance nanostructured TE legs directly around a curve shaped thermal source surface, such as an automobile exhaust pipe. Other alternatives can also be provided where certain processes are added, one or more processes are removed, or one or more processes are provided in a different sequence without departing from the scope of the claims herein. Further details of the method can be found throughout the present specification and more particularly below.

The methods disclosed above all start with a uniwafer structure comprising pre-fabricated nanostructured arrays within a partial thickness of a single wafer doped specifically for enhance thermoelectric properties. For example, a Si-based uniwafer structure includes a properly doped silicon wafer comprising arrays of nanowires formed within a partial thickness of the same wafer and the arrays of nanowires are substantially vertical relative to the wafer surface and all nanowires are embedded in a fill material. The partial thickness of nanostructure material is about half, three fourth, or more of the total thickness of the uniwafer structure. In a specific example, a 150-mm sized silicon wafer has a 600 μm in total thickness and arrays of nanowires having lengths over 400 μm are formed vertically into a front surface of the wafer. For a 200-mm sized silicon wafer, the total thickness may be about 775 μm. Arrays of nanostructures in any forms like nanowires or nanoholes or nanotubes can be formed from a front surface with a depth over 400 mm into the wafer. The intermediate regions between the nanowires or nanotubes can be filled with a low thermal conductivity material such as silicon oxide or silicon nitride or other composite materials to form a matrix with embedded nanostructures therein.

Process 1002, 1102, or 1202 is to define bulk-sized units out of the nanostructured thermoelectric uniwafer structure. In certain embodiments, these processes are performed by cutting partially into the nanostructured thermoelectric uniwafer structure from its front surface to form a plurality of trenches, thus defining multiple units of the nanostructure material. Each trench has a first width and a first depth. The first width of each trench is determined to form a gap between neighboring units. The first depth is configured to be about a few tens of microns greater than the partial thickness of the pre-fabricated nanostructure material but still substantially smaller than the total thickness of the uniwafer structure. In a specific embodiment, the thickness of nanostructure material (for example, an embedded silicon nanowires array) on the uniwafer structure is about 400 μm or greater. Correspondingly the cutting step executed in those processes is performed to form the trenches with depths at least 420 to 490 μm. A diamond saw is used as a cutting tool which is capable of controlling the cutting depth accuracy within a few microns. The width of the trenches can be controlled by numbers of cuts and saw dimension. It is intended to make the first width large enough for a refilling process and a second cutting process around the trenches while still relatively small to save wafer material. The cutting can be done at least in two directions so that each of the multiple units of nanostructure material is surrounded by the trenches having the first width. In another specific embodiment, the trenches can be formed by patterning, etching, and cleaning process combinations.

Figure 4:
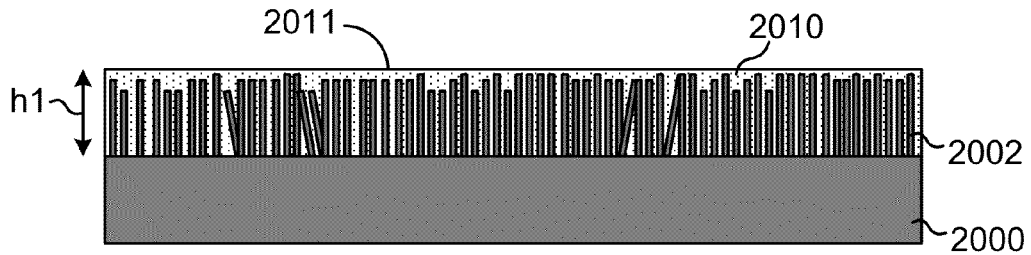
FIGS. 4-18, 20-22, and 24 are sectional views of a nanostructured thermoelectric uniwafer structure in processes for manufacturing a plurality of bulk-sized nanostrucrtured thermoelectric legs according to embodiments of the present invention.
Figure 5:
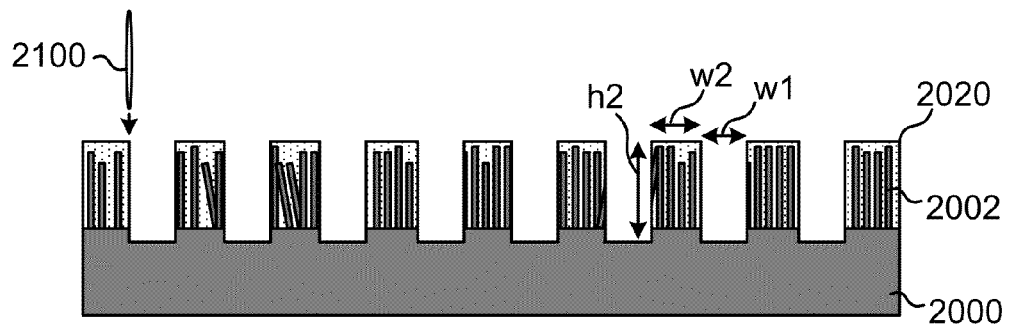

FIG. 4 and FIG. 5, in an example, show a schematic partial sectional view of a uniwafer structure. As shown in FIG. 4, a thermoelectric uniwafer structure is made from a silicon substrate 2000, pre-doped either p-type or n-type impurities for enhancing thermoelectric functionality. Of course, the techniques described here are applicable to other nanostructured uniwafer structures. A plurality of silicon nanowires (SiNWs) 2002 is formed substantially vertically into the substrate 2000 up to a depth h1, which also represents an average length of all the nanowires. The silicon substrate can be doped to n-type or p-type with substantially high impurity concentration around a level of $10^{20}$ CM$^{-3}$. So do the formed SiNWs bear high doping level either in an n-type or a p-type semiconductor characteristics. A fill material 2010, which is a low thermal conductivity composite material, is then applied with semiconductor SOD and/or SOG techniques to fill in intermediate regions of the SiNW arrays 2002. Then an annealing process is performed to allow a formation of a surface region 2011 such that the fill material 2010 is sufficiently over all the SiNW arrays 2002. In other words, the SiNW arrays 2002 are substantially embedded in the fill material 2010. In an embodiment, nanostructures with high aspect ratio in vertical direction relative to the surface of the substrate 2000 including nanowires, nanotubes, nanorods and more, can be applied here. In another embodiment, the fill material 2010 is a low conductive material both electrically and thermally, and characterized by its ability withstanding high-temperature (for example, greater than 700° C.).

As shown in FIG. 5, the thermoelectric uniwafer structure is partially cut into multiple chips 2020 separated by trenches having a predetermined first width w1 and a first depth h2. The cutting operation is applied from the surface region 2011 of the thermoelectric uniwafer structure. Many cutting techniques including mechanical cutting by dicing saws (as an example, a dicing saw 2100 is shown in FIG. 5) or laser cutting via a high-power beam from a laser source can be applied in Process 1002. The cutting operation is performed on multiple locations to form many such trenches to yield multiple chips 2020 each comprising SiNW arrays having a lateral width of about w2 and lengths of about h2. For example, the chips 2020 may be made in sizes selected from 10×10 mm, or 4×4 mm, or others. In an embodiment, individual thermoelectric legs with one or more desirable sizes will be fabricated from these chips. The trench width w1 is also selected to allow enough spacing for subsequent processing performed in substantially the same regions from backend of the thermoelectric uniwafer structure. The trench depth h2 may be controlled so that it is slightly greater than h1. In other words, the trench depth is made to be greater than the average length of all the nanowires so that the trenches are able to reach a backend region of substantially all nanowires. The cutting widths and depths of these trenches can be controlled accurately by a SonoTrace device or an optical inspection tool.

Figure 6:
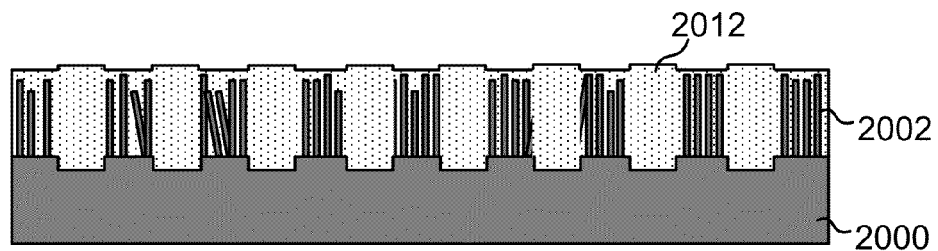

Process 1006, 1106, or 1206 is then applied for adding a second fill material 2012 into the trenches. This process is schematically illustrated in FIG. 6. In an embodiment, the second fill material 2012 can be the same as the first fill material 2010 characterized by a substantial insulator both thermally and electrically while a mechanically strong material. In another embodiment, the second fill material 2012 can be one selected from nonconductive ceramic, glass, high-temperature (700-800° C.) resilient polymer, silicon dioxide, and silicon nitride, or other composite materials. In the descriptions below, the either the first fill material 2010 or the second fill material 2012 is simply referred to fill material. Now the SiNW array 2002 within each chip 2020 is completely surrounded by the fill material 2012.

Figure 7:
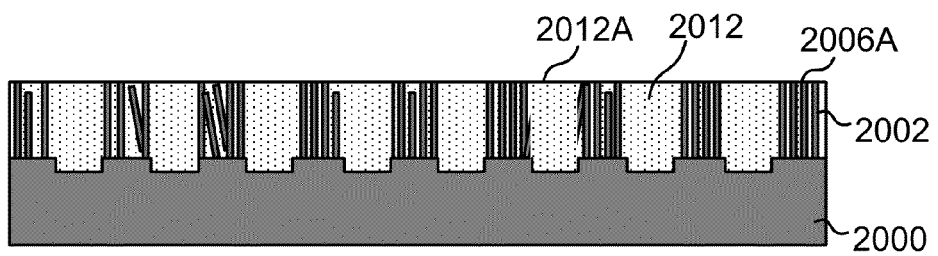
Figure 8:
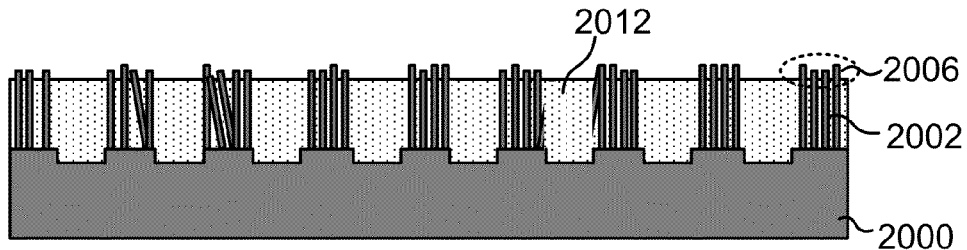

Referring to FIGS. 1, 2, and 3, Process 1010, 1110, or 1210 is applied for polishing the front surface to expose a frontend region of nanostructure material in each unit. In an embodiment, the process 1010 or 1110 is to remove extra portion of the fill material near a vicinity of the surface region 2011 to form a front surface 2012A including exposed frontend region of the prefabricated nanostructure, as shown in FIG. 7. The polishing process can use a combination of chemical-mechanical-polishing and physical-chemical etching although other techniques are not excluded. In an optional embodiment, the process 1210 may also include a recession etching to remove additional portion of fill material 2012 around nanostructure arrays 2002 for each unit. As a result, as shown in FIG. 8, a protruded region 2006 for each unit of the nanostructure arrays 2002 is formed to facilitate direct metal decoration via a sputter deposition, as shown schematically in FIG. 9. The recession etching is carried using a reactive ion etching technique which selectively removes dielectric fill material while keeping silicon material substantially un-affected, though other techniques can be applied. The process shown in FIG. 8 (and subsequent one in FIG. 9) is merely optional to use recession etching technique to form the protruded region of nanostructure array and can be omitted or replaced by directly forming a conductive contact layer (shown in following sections of the specification and FIG. 10) overlying the whole front surface 2012A including the exposed frontend regions of all nanostructured units. In a specific embodiment, the nanostructure is SiNW arrays and tip portions of the SiNW arrays 2002 associated to each unit are exposed. The etch rate of the reactive ion etching can be monitored by using optical inspection or using SEM to perform spot check in specific region. More details about the formation of the protruded regions for the SiNW arrays for the manufacture of nanostructured thermoelectric legs can be found in U.S. patent application Ser. No. 13/331,768, filed on Dec. 20, 2011, commonly assigned to Alphabet Energy, Inc. at Hayward, Calif., and incorporated as references for all purposes.

Figure 9:
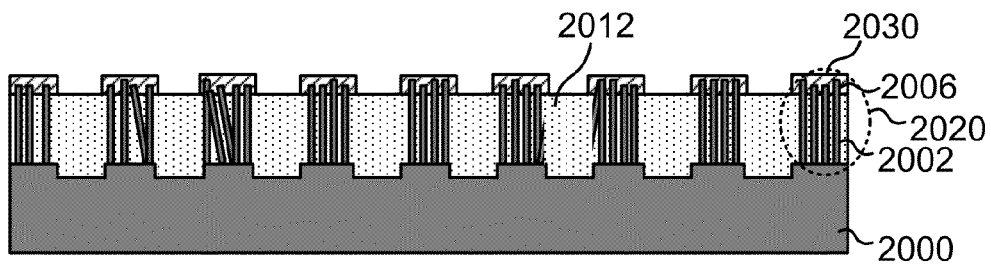

Process 1018, 1118, or 1218 is applied for forming a conductive contact layer overlying the front surface of the uniwafer structure after the polishing process. In a specific embodiment, as shown in FIG. 9, a metallization process is executed for depositing metal or metal alloy to form a metalized contact cap 2030 specifically decorating the protruded region 2006 of the silicon nanowires 2002. The size of the metalized contact cap 2030 is sufficiently large to cover entire protruded region 2006 of SiNW arrays per chip 2020 while still leaves a gap between the contact caps 2030 across the frontend of the thermoelectric uniwafer structure. In an example, atomic layer deposition is an optional technique for forming the metalized contact spot, though other methods like sputtering technique can be applied. In another example, the contact metallization is performed via sputtering of metal or metal alloy material selected from Al, Cu, Ni, Ti, TiN, Au, Au—Sn alloy, W, or W—Pt—B alloy to form the decorated spot around protruded region of SiNW arrays. The process 1018 usually also includes a thermal annealing following metal deposition. Again, optical inspection and SEM spot check are used for monitoring the process and subsequent electrical measurement is performed to determine the contact resistance. The thermal annealing may employ localized heating of one or more metal/alloy material near the interface.

Figure 10:
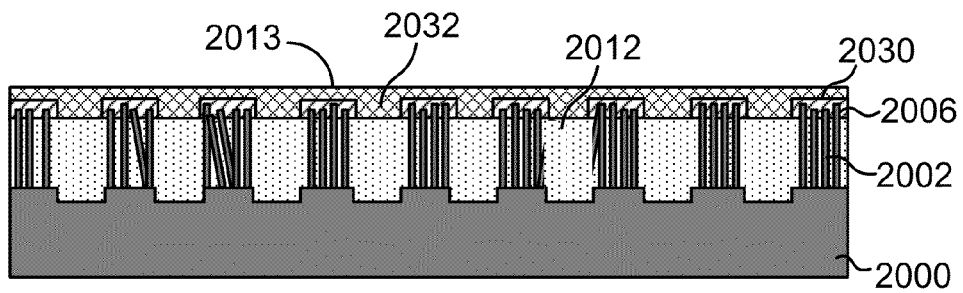

Subsequently, a metal contact layer is formed next to overlay all the metalized contact spots and remaining area with the fill material. As shown in FIG. 10, a metal contact layer 2032 is formed overlying all the metalized contact caps 2030 as well as the exposed portion of fill material 2012. In a specific embodiment, the metal contact layer 2032 is formed with a smooth top surface region 2013 for forming good thermal contact in thermoelectric applications. In an example, electrochemical deposition (ECD) technique is used to deposit a thickness of copper material for substantially covering all the exposed area of the fill material and the entire metalized contact cap associated with SiNW arrays per chip. The metal contact layer 2032 is characterized by a thickness and film uniformity. The thickness of the metal contact layer may be varied depending on the roughness of the frontend region after the metallization process. The metal contact layer 2032 is designated to ensure the electrical continuity at the frontend of the thermoelectric uniwafer structure among all SiNW arrays. Due to relative large thickness variation among all metalized contact spots around protruded regions of SiNW arrays surrounded by regions of the fill material, relative large thickness of the metal contact layer 2032 is deposited. In an example, 10 to 15 microns of copper material may be deposited. In an embodiment, the ECD process is an excellent deposition technique for filling rough trenches with high deposition rate to achieve both good film uniformity and a smooth surface region within a reasonable total thickness. Optical inspection and SEM spot check techniques are used to monitor the process and 4-point probe measurement of the resistance of the metal contact layer is performed.

Figure 11:
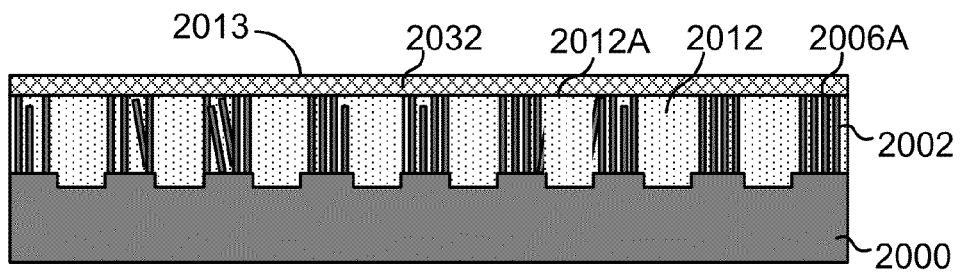

In an alternative embodiment, as shown in FIG. 11, the metal contact layer 2032 is directly formed overlying the polished front surface 2012A including the exposed frontend regions 2006A of the nanostructure material. Many techniques can be used to deposit the metal or other conductive material to form the contact layer with a smooth top surface 2013 and certain thickness to ensure full coupling of all the units of nanostructured material throughout the front surface of the modified uniwafer structure. In an embodiment, a certain thickness of the metal contact layer 2032 can be formed to meet a requirement to make it a direct thermal contact (for example used at cold side) of to-be-fabricated TE legs. Or, alternatively, the metal contact layer 2032 can be bonded to a conductive pad associated with a thermal contact plate via a brazing material selected from a list of metals or their alloys including Gold (Au), Silver (Ag), Copper (Cu), Nickel (Ni), Platinum (Pt), Palladium (Pd), Tungsten (W), Titanium (Ti), Titanium nitride (TiN). There are other alternatives, variations, and modifications in selecting bonding material, configuring bonded conductive pads within the thermal contact plate, and selecting rigid or flexible contact plate, which are partially beyond the scope of the present invention although some approaches will be described below.

Process 1022 or 1222 is then applied for temporarily bonding a carrier wafer to the top surface of the just formed metal contact layer. The carrier wafer is a reusable ceramic disk that has similar shape and size versus the thermoelectric uniwafer structure. The bonding process can be performed using a zone bonding technique although other methods are possible. The zone bonding technique employs a bonding material at two different zones allowing just a small area near outer edge of the carrier wafer to be bonded with the metal contact layer while rest portions of the carrier wafer remain not bonded but fully supported with the metal contact layer. Since the bonding process is a temporary process, the rest portion of the carrier wafer is not bonded to the contact layer from the frontend of the thermoelectric uniwafer structure so that a debonding process can be easily performed later. Alternatively, process 1122 is applied to bond a thermal contact plate (or wafer) that will eventually serve the cold-side contact for the to-be-fabricated TE legs. This bonding process can be a brazing process via a brazing material selected from a list of metals or their alloys including Gold (Au), Silver (Ag), Copper (Cu), Nickel (Ni), Platinum (Pt), Palladium (Pd), Tungsten (W), Titanium (Ti), Titanium nitride (TiN). No de-bonding process for this contact plate is required.

Figure 12:
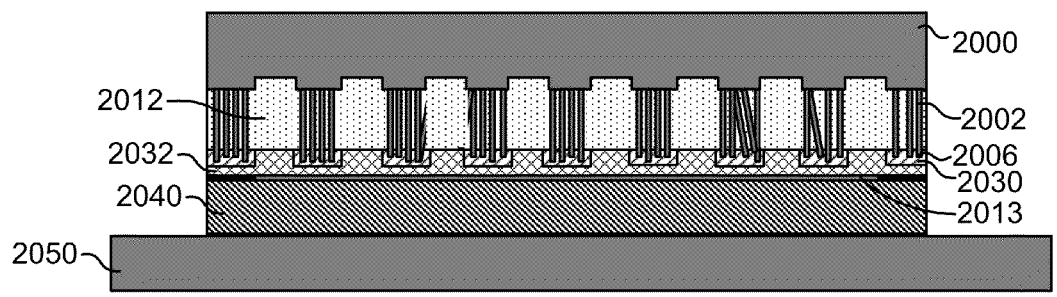

Followed by this process, a process 1026, 1126, or 1226 is performed to attach a lapping disk to the carrier wafer (or contact plate). FIG. 12 just illustrates that a modified thermoelectric uniwafer structure, flipped over from the structure shown previously in FIG. 10, is configured to allow the surface region 2013 of the metal contact layer 2032 to bond with a carrier wafer 2040. Further, a lapping disk 2050 is subsequently attached to the carrier wafer 2040. In an example, the acetone activated Gel-Pak film is used for attaching the lapping disk to the carrier wafer. After all, the whole structure is configured to set the lapping disk 2050 at bottom side for handling convenience and make the original backend facing up ready for further processing according to the present methods.

Process 1030, 1130 or 1230 is subsequently carried out to remove substantial amount of substrate silicon material 2000 from the backend region (now facing up) of the thermoelectric uniwafer structure, as shown schematically in FIG. 13. In an embodiment, this process is a lapping process carried out with the lapping disk 2050 being held at a lapping equipment. The process is continued until the fill material 2012 appears with substantially amount of solid material of original uniwafer being removed from the backend. This process includes both rough lapping and optional finer polishing. The lapping disk 2050 is necessary for supporting the thermoelectric uniwafer structure bonded with the carrier wafer 2040 during the whole lapping process. Optical inspection and SEM spot check techniques are also used for monitoring the process and stopping the process at right time.

Figure 13:
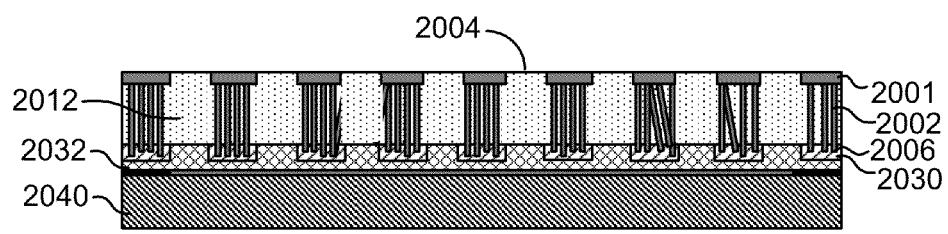

As shown in FIG. 13, corresponding to each unit of nanostructured material a portion of original uniwafer solid material 2001 retains after the lapping process to form an island surrounded by the (exposed) fill material 2012 within the polished backend surface region 2004. The retained island of solid material 2001 is directly bonded to the backend regions of the unit of nanostructure material 2002 (for example, array of SiNWs). The height of the island of solid material 2001 is substantially depended on a difference between the trench depth h2 (see Process 1002) and the length scale h1 of the nanostructure material 2002. After the lapping process, the lapping disk 2050 is detached in Process 1034, or 1134, or 1234, followed by DI water rinsing clean of the polished backend region 2004 of the thermoelectric uniwafer structure while it is still bonded (at the frontend region) with the carrier wafer (or contact plate) 2040.

Referring respectively to FIGS. 1, 2, and 3, Process 1038, 1138, or 1238 for forming a conductive backend layer overlying the polished backend region substantially coupled with all units of nanostructure material under each island of the remaining solid material or original uniwafer. The carrier wafer 2040 will be retained during the process for supporting the uniwafer structure. The polished backend region 2004, comprising a plurality of islands 2001 embedded in the fill material 2012, is characterized by a relatively small roughness without substantially voids or canyons existed in the exposed fill material region.

In a specific embodiment, each island of solid material 2001 within the backend region 2004 is structurally intact as a natural extension of the corresponding nanostructure material pre-fabricated from a same uniwafer material. A metallization process similar to Process 1018 can be carried to form a conductive contact layer overlying the entire backend region including the regions of the fill material and regions of the islands.

Figure 14:
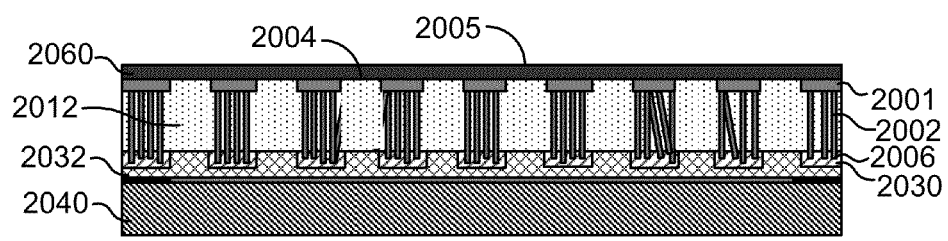

In another specific embodiment, a method for forming the conductive backend layer on such a polished backend region, as shown in FIG. 14, is to attach a thin layer of conductive material 2060 directly to the polished backend region 2004. For example, the thin layer of conductive material may be a thin metal shunt made a foil or thin plate. This may also be carried out through a whole-wafer bonding process. For example, an ultra-thin silicon handle wafer 2060, which can be provided with a thickness of 50 µm or less (preferably 15 µm or less), is directly attached on the polished backend region 2004 using a process similar to the bonding of SOI wafers with oxide embedded between two thin silicon wafers. In another example, the ultra-thin silicon handle wafer can be pre-doped with high concentration of electrical impurities to a similar level (about $10^{20}$ $cm^{-3}$ or higher) of the original silicon substrate for forming the SiNWs. Therefore, no additional electrical resistance is introduced between the silicon handle wafer and the SiNWs when the silicon handle wafer is bonded with the polished backend region. Nevertheless, the handle wafer 2060 becomes the conductive backend layer of the thermoelectric uniwafer structure. In yet another example, a thin metal foil or a conductive pad attached with a flexible insulation film (such as polymide film) may be used as the handle wafer to bond with the polished backend region. In yet another example, a silicide or conductive ceramic material may be used to directly bond with the polished backend region.

In a specific embodiment, the bonding process may employ localized heating of material near the interface. As the polished backend surface region 2004 has a comparable smoothness of the handle wafer 2060, the handle wafer 2060 and the silicon islands 2001 coupled to the SiNW arrays can form very good bonding between each other, providing an excellent electrical pathway. After the bonding, the ultra-thin handle wafer 2060 can further serve as a base plane of a thermoelectric leg for forming very good quality thermal contact with potential hot face in any thermoelectric applications.

In an alternative embodiment, the process for forming the conductive contact layer may be similar to the processes 1014-1018 for forming a metal contact layer at frontend of the thermoelectric uniwfer structure. For example, an etch process may be employed to form protruded region of SiNW at the backend followed by a metallization process to form good Ohmic contact spots around all the protruded regions in the backend region. Subsequently, a thin metal layer may be deposited for substantially covering all the contact spots and form a contact layer connected electrically to substantially all arrays of SiNWs at the backend surface region.

Figure 15:
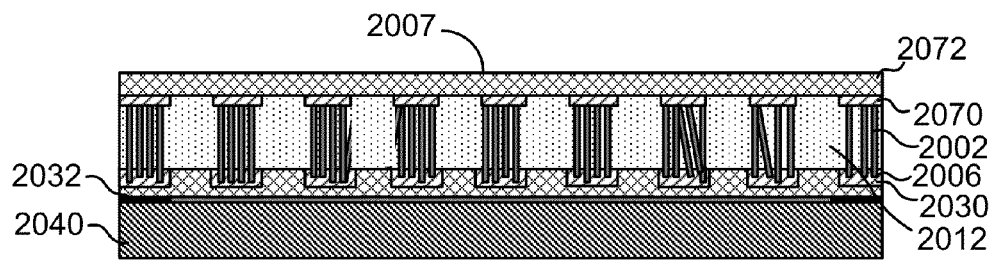

FIG. 15 schematically illustrates such an embodiment of a metallization process of forming a plurality of contact caps 2070 decorating the protruded tip regions of SiNWs followed by a deposition process of forming a metal contact layer 2072 overlying the metalized contact spots as well as rest backend surface region. The metallization process may involve depositing (locally) metal or metal alloy material selected from Al, Cu, Ni, Ti, TiN, Au, Au—Sn alloy, W, W—Pt—B alloy, metal silicide, or other materials. The process may lead to a surface region not so smooth, ECD technique is a good option for depositing the metal contact layer. Depended on roughness of the metalized surface, the metal contact layer may comprise a thickness of 1-2 µm, or 5-8 µm, or 10-15 µm or greater of copper or other suitable high conductive metal/metal alloy. In a specific embodiment, thermal annealing may also be performed during or after the metallization process and after the metal contact layer deposition. For example, the metal contact layer 2072 is designated for forming full electrical contacts with substantially all arrays of SiNW at the backend region of the thermoelectric uniwafer structure. In another embodiment, the planar semiconductor process for the backend contact substantially reduces the residue mechanical stress and enhances the application reliability of the nanostructured TE legs. Particularly, the conductive backend contact of the nanostructured TE legs is designated for withstanding high temperature stress when attaching to a hot side of the thermal junction in thermoelectric power generation applications.

Figure 16:
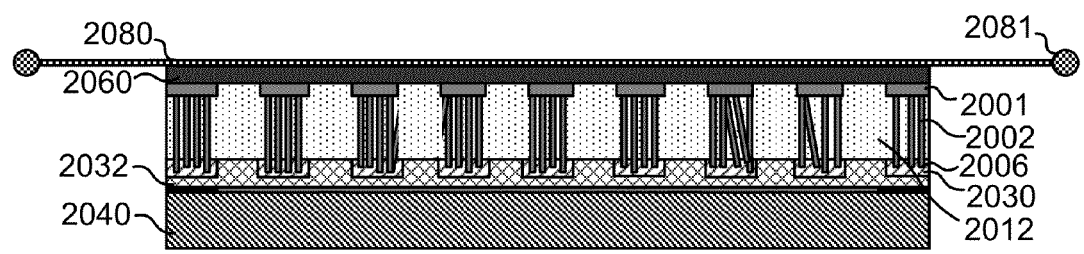

Following the formation of the conductive backend contact layer associated with the nanostructured thermoelectric uniwafer structure, Process 1042 or 1142 is applied for attaching a tape material onto the conductive backend contact layer. In the example that the conductive backend contact is formed by directly bonding a handle wafer to the polished backend surface, FIG. 16 shows schematically a carrier tape 2080 is attached to the handle wafer 2060. The carrier tape 2080 is pre-stretched via a round frame 2081 so that the tape can be smoothly bonded with substantially entire surface region of the handle wafer 2060. Alternatively, Process 1242 is applied for attaching a flexible substrate to the conductive backend contact. The flexible substrate itself can be conductive material. For example, a metal foil can be used. This flexible substrate is designated to serve as a direct contact base material that can be applied to curved or exotic shaped thermal source in many waste heat recovery applications.

Figure 17:
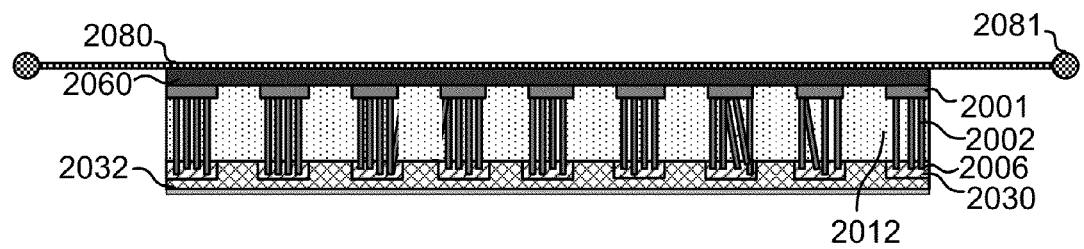

In another embodiment, after the whole uniwafer structure is transferred onto the carrier tape, a process 1046 or 1246 for de-bonding the ceramic carrier wafer from the frontend of the uniwafer structure. As shown in FIG. 17, the carrier wafer 2040 bonded in earlier process at the frontend (now facing downward in the figure) has been removed and a surface region of the frontend contact layer 2032 is re-exposed, while the modified uniwafer structure has been attached its backend to a carrier tape 2080. As mentioned earlier, zone bonding process was carried in Process 1022 (or 1222) so that most portions of surface region are not bonded with the carrier wafer, making the de-bonding process (1050) now much easier. In an example, this process is carried out in a temporary structural holder that can support the de-bonding of the carrier wafer made from a ceramic material. Of course, there are many alternatives, variations, and modifications. For example, this process is omitted if the carrier wafer 2040 is a pre-selected contact plate (see Process 1122) that will be directly used as cold-side thermal contact in thermoelectric module.

Figure 18:
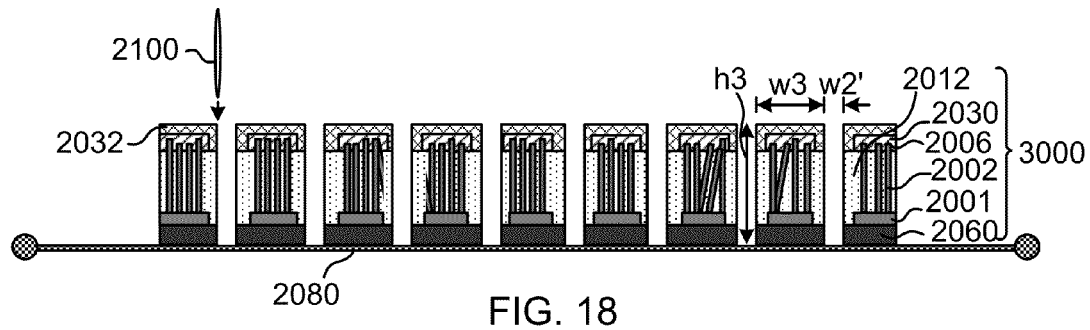

Referring back to FIG. 1 or FIG. 3, another cutting process 1050 or 1250 is executed from the frontend region of the modified thermoelectric uniwafer structure with its backend surface bonded on the carrier tape. FIG. 18 schematically illustrate the cutting process 1050 or 1250 starting from the re-exposed front contact layer 2032 and cutting with alignment into the trenches previously defined with the fill material 2012. Cutting is controlled to set its depth being stopped before reaching the carrier tape and set its width properly by number of cuts, resulting in multiple chip structures. In an embodiment, the cutting operation can be substantially similar to the cutting operation 1002 or 1202. As shown in FIG. 18, a dicing saw 2100 may be utilized for cutting into the frontend conductive contact layer 2032 of the modified nanostructured thermoelectric uniwafer structure while its backend region is bonded to the carrier tape 2080. The cutting operation includes multiple directions (for example, in a series of X-direction cuts following a series of Y-direction cuts, assuming a typical two dimensional arrangement) to produce multiple chip structures 3000 out of the whole modified uniwafer structure.

Figure 19:
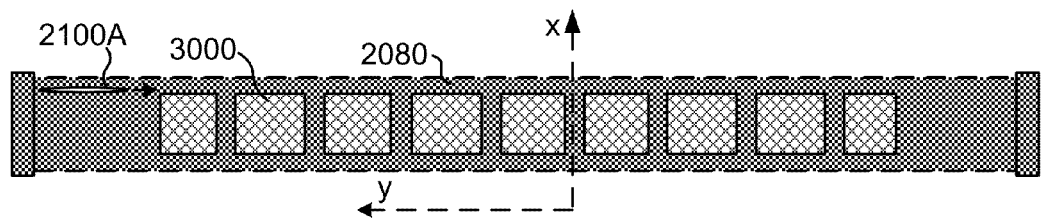
FIGS. 19 and 23 are top views of is a sectional view of a nanostructured thermoelectric uniwafer structure in processes for manufacturing a plurality of bulk-sized nanostrucrtured thermoelectric legs according to embodiments of the present invention.

FIG. 19 shows a simplified top view of a series of chip structures 3000 retained on the carrier tape 2080 after multiple cuts executed through the process. In particular, the cutting lines are set to align with original trenches formed in previous Process 1002 or 1202 for defining the units of nanostructure material on the uniwafer structure. In a specific embodiment, the cutting operation is controlled to create a gap with a second width w2' that is smaller than the first width w2 (of the original trenches). A well-controlled, smaller second width w2' that separates the neighboring chip structures 3000 ensures a finite amount of fill material 2012 to be retained to surround each unit of nanostructure material. The cutting depth h3 is also controlled to be substantially equal to the total thickness of the modified thermoelectric uniwafer structure including the nanostructure material and conductive contact layer formed on both frontend and backend, but just avoiding the carrier tape material 2080 attached to the backend region (which serves as a holding base for these chip structures 3000. For example, as shown in FIG. 18, dicing saw 2100 cuts through the frontend contact layer 2032 (including metalized spot 2030), the whole length of nanostructure material 2002 (including extra thickness of remaining uniwafer solid material), and the backend contact layer 2050, and stops as the carrier tape 2080 is reached. The cutting process 1050 adopts standard planar semiconductor processing techniques and produces multiple chip structures 3000 (respectively held on the carrier tape). Each chip structure 3000, having a lateral dimension w3 and a height h3, is characterized by a bulk-sized nanostructure material embedded/surrounded by a non-conductive fill material and capped by properly selected conductive material. For example, the lateral dimension w3 can be varied from a few millimeters to centimeters and the height h3 can be in millimeter scale, depending on applications.

Figure 20:
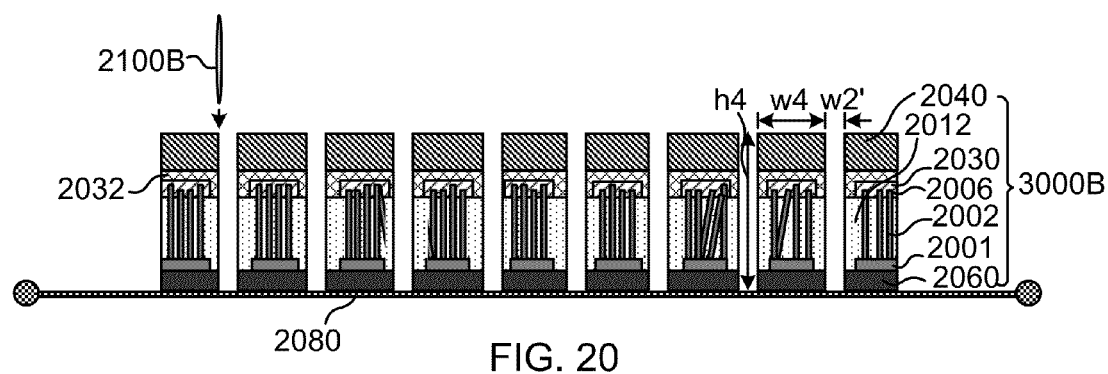

Referring to FIG. 2, alternatively, the carrier wafer is retained as a thermal contact plate so that Process 1146 is applied to cut from a surface of the contact plate into the modified nanostructured thermoelectric uniwafer structure. For example, the carrier tape is replaced by a flexible ploymide film configured with certain conductive regions to making contact with the corresponding chips from the modified nanostructured thermoelectric uniwafer structure. The conductive regions are arranged in certain layout pattern connected by conductive thin film overlying the basically insulating polymide film for the manufacture of a thermoelectric packaged device. FIG. 18 schematically illustrates that the cutting process 1146 starts from the contact plate 2060 attached to the front conductive layer of the modified nanostructured thermoelectric uniwafer structure and cuts with alignment into previously defined trenches filled with the fill material 2012 (in Process 1106). Process 1146 is substantially the same as Process 1050 on using a dicing saw 2100B to cut with directional-alignment (along both x and y directions) and with-depth control, except that the cutting depth h4 is greater than cutting depth h3 in Process 1050. The cutting process 1146 leads to a formation of a plurality of chip structures 3000B individually sit on the carrier tape 2080, as shown in FIG. 20. Each of the chip structure 3000B has its own thermal contact piece retained on its front end, which can be applied directly to a cold-side heat exchanger associated with a thermoelectric application. The chip structure 3000B has a bulk-sized lateral dimension w4 and height h4, ranging from millimeters to centimeters.

Figure 21:
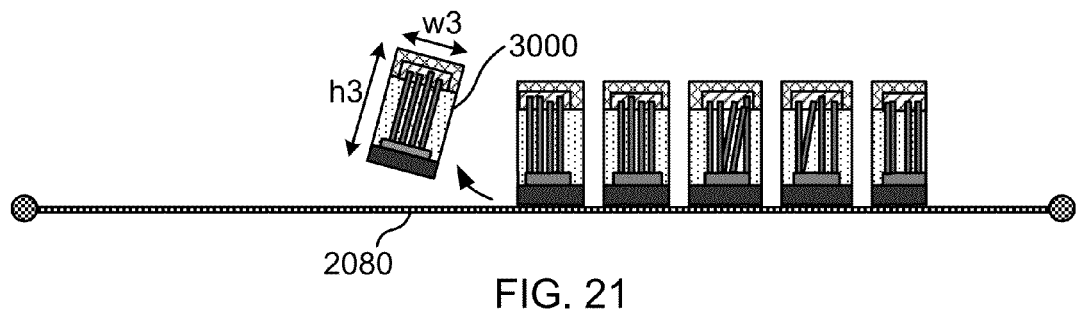
Figure 22:
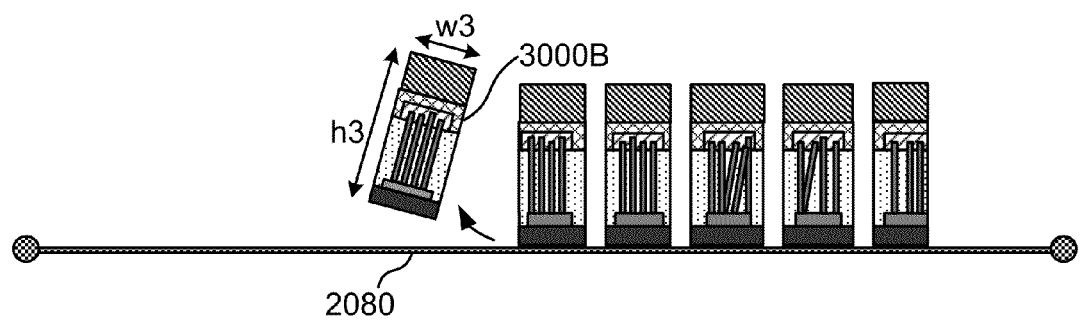

In an embodiment, Process 1054 or 1150 is applied for picking up each individual chip structure 3000 or 3000B from the carrier tape 2080, as shown in FIG. 21 or FIG. 22. Each chip structure 3000 (3000B) is characterized by a bulk-sized nanostructure composite material pre-fabricated in a uniwafer semiconductor material modified to include a side-surrounding non-conductive fill material and two end-capping conductive contact materials. In an embodiment, the chip structure 3000 (3000B) forms a bulk-sized nanostructured TE leg. Further, the nanostructure composite material within each chip structure possesses good thermoelectric function with high electrical conductivity and low thermal conductivity, forms a mechanical strengthened body by embedding and surrounding with the nonconductive fill material, and forms good quality Ohmic contacts respectively with both a frontend region and a backend region via capped conductive materials. The conductive frontend and backend of each chip structure provide two thermal contact bases of the bulk-sized nanostructured TE leg for respectively attaching with a hot side and a cold side of a thermal junction. At the same time the conductive frontend and backend also respectively serve as two electrodes bearing a thermoelectric voltage across the thermal junction.

Within each chip structure, the doping characteristic of the nanostructure material can be either an n-type or a p-type, resulting from a doping process performed to fabricate the nanostructures from original wafer structure and resulting in an n-type TE leg or a p-type TE leg. By performing one or more thermal/electrical tests, each individual TE leg including the conductive frontend/backend electrodes can be evaluated. The backend of each TE leg formed by the method described above is designated for attaching to the hot side of the thermal junction and the frontend of the same TE leg is designated for attaching to the cold side of the same thermal junction. When both the n-type and p-type TE legs are available, a thermoelectric module can be formed by assembling the n-type and p-type TE legs in a predetermined electrical configuration that shares common hot-side and cold-side of a thermal junction. Referring to FIG. 1 (3), after every chip structure 3000 (3000B) is picked up from the bonding carrier tape 2080, the method 1000 (1100) stops at a process 1058 (1154). Of course, there are many variations, alternatives, and modifications.

Figure 23:
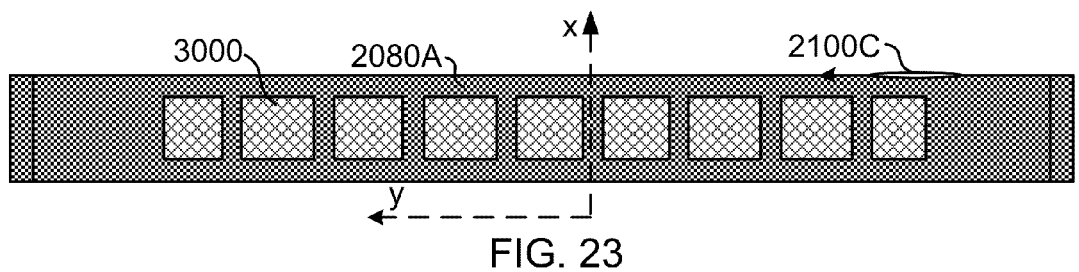

Referring again to FIG. 3, in an alternative embodiment, after the cutting process 1250 to produce a plurality of chip structures on a flexible substrate, another cutting process 1254 is applied to form a stripe of the flexible substrate with a series of chip structures retained thereon. FIG. 23 is a schematic top view of a stripe of flexible substrate 2080A being cut by a dicing saw 2100C from the whole flexible substrate, and on the stripe of flexible substrate 2080A a series of chip structures 3000 are still attached. In an example, the flexible substrate is a polymide film pre-configured to include array of conductive pads to making contact with the corresponding chip structures from the modified nanostructured thermoelectric uniwafer structure. The conductive pads are arranged in certain layout pattern connected by conductive thin film overlying the basically insulating polymide film for the manufacture of a thermoelectric packaged device. Each chip structure 3000 is either n-type or p-type thermoelectric functionalized thus becoming an either n-type or p-type bulk-sized TE leg. The stripe of flexible substrate 2080A is applicable as a common thermal contact base as well as an electrode for all the series of attached TE legs. For assembling a thermoelectric module, similar stripe structures can be picked with alternative n-type or p-type characteristics independently fabricated based on methods described above.

Figure 24:
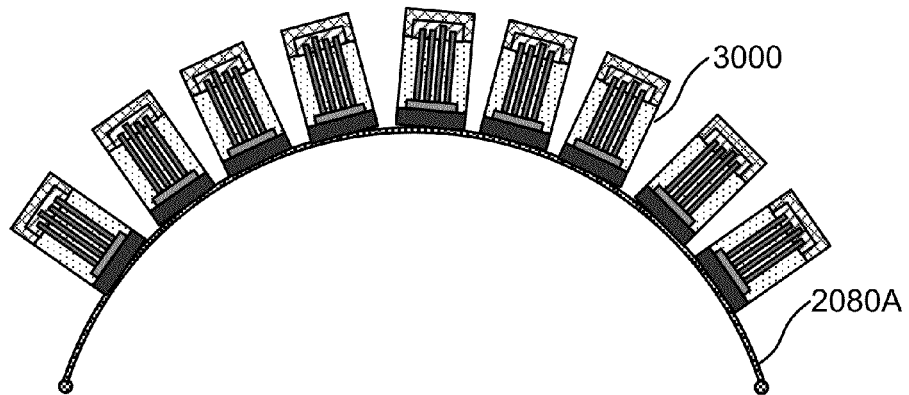

Optionally, Process 1258 can be applied to bend the stripe of flexible substrate with a series of TE legs attached on it. Depending on the substrate material, structure and material of the attached TE legs, and particular thermoelectric applications, the flexible substrate can be bended to a curve shape, e.g., a hemi-circle, or even a full circle shape, or other irregular shape. For example, the flexible substrate can be made from a metal foil that is capable of taking various shapes. FIG. 24 is a schematic diagram showing a stripe of flexible substrate 2080A bended to hemi-circle shape with a series of bulk-sized nanostructured TE legs 3000 attached thereon. For example, this flexible substrate can be attached directly to a round shaped heat-exhaust pipe as a hot-side thermal contact of a thermoelectric module for recovering waste heat. Of course, the top ends of those TE legs 3000 shown in FIG. 24 are still not in contact with the hot-side thermal contacts yet. The bending scheme can also in opposite manner to have the hot-side at an inner curved face corresponding to, for example, a round heat exhaust pipe surface. The thermoelectric module can be assembled by one stripe of n-type TE legs followed by another stripe of p-type TE legs alternatively wrapped around the same exhaust pipe. The cold-side contact (not shown here) can be applied overlying each frontend region of all the TE legs attached on each stripe of the flexible substrate. Of course, there are many variations, alternatives, and modifications.

It is also understood that the examples and embodiments described herein are for illustrative purposes only and that various modifications or changes in light thereof will be suggested to persons skilled in the art and are to be included within the spirit and purview of this application and scope of the claims.

What is claimed is:

1. A method for fabricating a plurality of bulk-sized thermoelectric legs by a uniwafer process, the method comprising:
   providing a wafer substrate comprising a nanostructured material formed from a front surface into a first depth of a partial thickness of the wafer substrate;
   cutting the wafer substrate from the front surface into a second depth to define a plurality of nanostructured units separated by trenches, the second depth being a partial thickness of the wafer substrate slightly greater than the first depth;
   filling the trenches with a non-conductive material to above the front surface;
   polishing the front surface to remove an extra part of the non-conductive material and expose a front end region of each of the plurality of nanostructured units;
   metalizing the front end region of each of the plurality of nanostructured units;
   forming a first conductive layer overlying the front surface including areas of the metalized front end regions and a surface area of the non-conductive material;
   bonding a carrier wafer to the first conductive layer;
   lapping from a back surface of the wafer substrate until the non-conductive material is exposed at regions where the trenches are located, remaining regions of the remained wafer substrate for respectively connecting the plurality of nanostructured units;
   forming a second conductive layer overlying the entire back surface to form electrical contacts respectively with the remaining regions connecting to the plurality of nanostructured units;

attaching a carrier tape to the second conductive layer;
debonding the carrier wafer from the first conductive layer;
cutting from the first conductive layer with alignment into the vicinity of the filled trenches substantially through all materials except the carrier tape such that the plurality of nanostructured units is individually separated and respectively wrapped around by a remaining thickness of the non-conductive material.

2. The method of claim 1 wherein the wafer substrate is a silicon wafer doped with p-type or n-type impurities.

3. The method of claim 1 wherein the nanostructured material comprises silicon nanowires, nanoholes, nanotubes, and a nano-porous silicon and silicide material.

4. The method of claim 1 wherein the first depth is at least 400 µm and the second depth is greater than the first depth by 5 µm or less.

5. The method of claim 1 wherein each of the plurality of nanostructured units has a defined dimension ranging from 4 mm×4 mm to 10 mm×10 mm.

6. The method of claim 1 wherein the metalizing the front end region comprises sputtering a metal or metal alloy material selected from Al, Cu, Ni, Ti, TiN, Au, Au—Sn alloy, W, or W—Pt—B alloy to form decorated spot overlying the front end region.

7. The method of claim 1 wherein the forming a first conductive layer comprises using an ECD process for forming a metal film of 5 to 15 microns.

8. The method of claim 1 wherein the forming a second conductive layer comprises forming metallization decoration over end regions of each of the plurality of nanostructured units and growing a metal layer overlying the entire back surface for attaching conductive pads by brazing bonding.

9. The method of claim 1 wherein the bonding a carrier wafer comprises using a zone bonding technique for temporary attachment while allowing easy detachment after certain processes.

10. A method for fabricating a plurality of bulk-sized thermoelectric legs by a uniwafer process, the method comprising:
providing a wafer substrate comprising a nanostructured material formed from a front surface into a first depth of the wafer substrate;
cutting the wafer substrate from the front surface into a second depth of the wafer substrate to form a plurality of first trenches to separate a plurality of nanostructured units, the second depth being slightly greater than the first depth as a partial thickness of the wafer substrate;
filling the plurality of first trenches with a non-conductive material to above the front surface;
polishing the front surface to remove an extra part of the non-conductive material and expose a front end region of each of the plurality of nanostructured units;
metalizing the front end region of each of the plurality of nanostructured units;
forming a first metal layer overlying the front surface including each metalized front end region and the non-conductive material;
bonding a conductive contact plate to the first metal layer;
lapping from a back surface of the wafer substrate until the non-conductive material is exposed at regions corresponding to the plurality of first trenches for separating the plurality of nanostructured units and remaining regions of the remained wafer substrate for respectively connecting the plurality of nanostructured units;
forming a second metal layer overlying the back surface to form electrical contacts with the remaining regions respectively connecting the plurality of nanostructured units;
attaching a carrier tape to the second metal layer;
cutting from the conductive contact plate with vertical alignment along edge vicinity of all the plurality of first trenches to from a plurality of second trenches with depths further through the filled non-conductive material and the wafer substrate to cause the plurality of nanostructured units to be isolated except being still attached to the carrier tape via the second metal layer.

11. The method of claim 10 wherein the wafer substrate is a silicon wafer comprising a plurality of nanowires, nanoholes, nanotubes, and a nano-porous silicon and silicide material with an aspect ratio of 100:1 or greater and substantially aligned vertical from the front surface into the wafer up to the first depth of about 400 µm.

12. The method of claim 10 wherein the bonding a conductive contact plate comprises attaching a metal foil, a shaped metal shunt, or a highly doped ultra-thin silicon wafer to the first metal layer around a peripheral side.

13. The method of claim 12 wherein the bonding a conductive contact plate comprises using a brazing technique by locally melting added brazing elements around a contact region, the brazing elements including one or more metals or their alloy selected from Gold (Au), Silver (Ag), Copper (Cu), Nickel (Ni), Platinum (Pt), Palladium (Pd), Tungsten (W), Titanium (Ti), and Titanium nitride (TiN).

14. The method of claim 10 wherein the cutting from the conductive contact plate with vertical alignment along edge vicinity of all the plurality of first trenches comprises aligning cutting lines to form each of the plurality of second trenches with a smaller width than a first trench of the plurality of first trenches to retain a thickness of the non-conductive material around a peripheral side of each isolated nanostructured unit.

15. The method of claim 10 further comprising picking up each isolated nanostructured unit from the carrier tape to produce a bulk-sized nanostructured thermoelectric leg bearing a p-type or n-type characteristic same as the wafer substrate.

16. A method for fabricating a plurality of bulk-sized thermoelectric legs by a uniwafer process, the method comprising:
providing a wafer substrate comprising a nanostructured material formed from a front surface into a partial thickness of the wafer substrate;
forming trenches into the nanostructuerd material to define multiple nanostructured units, the trenches having a depth being slightly greater than the partial thickness associated with the nanostructured material;
filling the trenches with a non-conductive material to above the front surface;
polishing the front surface to remove an extra part of the non-conductive material and expose each front end region of each one of the multiple nanostructured units;
metalizing the front end region of each one of the multiple nanostructured units;
forming a metal layer overlying the front surface including the metalized front end region and the non-conductive material;
bonding a carrier wafer to the metal layer;
lapping from a back surface of the wafer substrate to expose the non-conductive material within regions aligned to the trenches and keeping remained pieces of the wafer substrate within remaining regions of the back surface connecting the multiple nanostructured units;

forming a conductive contact layer overlying the back surface to form electrical contacts with the remaining regions respectively connecting the multiple nanostructured units;

bonding a flexible substrate to the conductive contact layer;

debonding the carrier wafer to expose the metal layer; and cutting from the metal layer with vertical alignment along edge vicinity of all the trenches through the filled non-conductive material and the wafer substrate to cause the multiple nanostructured units to be isolated and remained attaching to the flexible substrate, each nanostructured unit being individually wrapped by a remaining thickness of the non-conductive material.

17. The method of claim 16 wherein the wafer substrate is a silicon wafer comprising a plurality of nanowires, nanoholes, nanotubes, and a nano-porous silicon and silicide material with an aspect ratio of 100:1 or greater and substantially aligned vertical from the front surface into the wafer substrate up to the partial thickness.

18. The method of claim 16 wherein the flexible substrate is a polymide film comprising multiple conductive regions arranged in a pre-configured pattern for bonding with the multiple nanostructured units.

19. The method of claim 16 further comprising cutting the flexible substrate including a portion of the multiple nanostructured units being attached thereon into a stripe shape for facilitating application with a bended shape.

* * * * *